(12) United States Patent
Yu et al.

(10) Patent No.: US 6,483,099 B1
(45) Date of Patent: Nov. 19, 2002

(54) ORGANIC DIODES WITH SWITCHABLE PHOTOSENSITIVITY

(75) Inventors: Gang Yu, Santa Barbara; Yong Cao, Goleta, both of CA (US)

(73) Assignee: DuPont Displays, Inc., Santa Barbara, CA (US)

( * ) Notice: Subject to any disclaimer, the term of this patent is extended or adjusted under 35 U.S.C. 154(b) by 0 days.

(21) Appl. No.: 09/485,535

(22) PCT Filed: Aug. 14, 1998

(86) PCT No.: PCT/US98/16935

§ 371 (c)(1),
(2), (4) Date: May 8, 2000

(87) PCT Pub. No.: WO99/09603

PCT Pub. Date: Feb. 25, 1999

(51) Int. Cl.[7] ................................................. H01J 40/14
(52) U.S. Cl. ..................................... 250/214.1; 257/103
(58) Field of Search ........................ 250/214 R, 214 LS, 250/214 SG, 214 RC, 214.1, 361 R, 372; 257/40, 82, 84, 85, 103, 482, 483

(56) References Cited

U.S. PATENT DOCUMENTS

| | | | |
|---|---|---|---|
| 5,142,343 A | * 8/1992 | Hosokawa et al. | 257/103 |
| 5,164,809 A | 11/1992 | Street | |
| 5,247,190 A | * 9/1993 | Friend et al. | 257/103 |
| 5,262,649 A | 11/1993 | Antonuk et al. | |
| 5,331,183 A | 7/1994 | Sariciftci et al. | |
| 5,454,880 A | 10/1995 | Sariciftci et al. | |
| 5,504,323 A | 4/1996 | Heeger et al. | |
| 5,523,555 A | 6/1996 | Friend et al. | |

OTHER PUBLICATIONS

R. A. Street, et al., Spring Meeting of Materials Research Society, San Francisco, Apr. 17–21, 1995.
J. Yorkston, et al., *Mat. Res. Soc. Sym. Proc.*, 116, 258, 1192.
R. A. Street, *Bulletin of Materials Research Society*, 11, 17–20, 1992.
Eric J. Lerner, *Laser Focus World*, 32 (12), 54, 1996.
G. A. Chamberlain, *Solar Cells*, 8, 47, 1983.
S. Karg, et al., *Syn. Metals*, 54, 427, 1993.
H. Antoniadis, et al., *Synth. Metals*, 64, 265, 1994.
G. Yu, et al., *Appl. Phys. Lett.*, 64, 1540, 1994.
G. Yu, et al., *Appl. Phys. Lett.*, 64, 3422, 1994.
N. S. Sariciftci, et al., *Science*, 258, 1474, 1992.
L. Smilowitz, et al., *Phys. Rev. B*, 47, 13835, 1993.
N. S. Sariciftci, et al., *Intern. J. Mod. Phys B.*, 8, 237, 1994.
B. Kraabel, et al., *Chem. Phys. Lett.*, 213, 389, 1993.*
B. Kraabel, et al., *Phys. Rev. B*, 50, 18543, 1994.*
C. H. Lee, et al., *Phys. Rev. B*, 48, 15425, 1993.*
G. Yu, et al., *Science*, 270, 1789, 1995.
G. Yu, et al., *J. Appl. Phys.*, 78, 4510, 1995.
J.J.M. Halls, et al., *Nature*, 376, 498, 1995.
S.M. Sze, *Physics of Semiconductor Devices*, Part 5, 1981.
A. J. Heeger, et al., *Optics & Photonics News*, 24, Aug. 1996.
G. Gustafsson, et al., *Nature*, 357, 477, 1992.
R. N. Marks, et al., *J. Phys.: Condens. Matter*, 6, 1379, 1994.

* cited by examiner

*Primary Examiner*—Stephone Allen

(57) ABSTRACT

Organic diode detectors with switchable photosensitivity are achieved using organic photo layers in the photodiodes and a detector circuit which applies a reverse or forward bias voltage across the diodes. The diodes can be arranged in matrices which function as high performance, two-dimensional image sensors. These image sensors can achieve full color or selected color detection capability.

58 Claims, 18 Drawing Sheets

ORGANIC DIODES WITH SWITCHABLE PHOTOSENSITIVITY

FIELD OF THE INVENTION

The present invention relates to organic photodiodes and to their use in two dimensional image sensors. In more preferred embodiments it concerns organic photodiodes which are voltage switchable and which may be arrayed as image sensors in the form of a column-row (x-y) passively addressable matrix, where the x-y addressable organic image sensors (image arrays) have full-color or selected-color detection capability.

BACKGROUND OF THE INVENTION

The development of image array photodetectors has a relatively long history in the device industry. Early approaches to imaging technology included devices based on thermal effects in solid state materials. These were followed by high sensitivity image arrays and matrices based on photodiodes and charge coupling devices ("CCDs") made with inorganic semiconductors.

Photodiodes made with inorganic semiconductors, such as silicon, represent a class of high quantum yield, photosensitive devices. They have been used broadly in visible light detection applications in the past decades. However, they characteristically present a flat photocurrent voltage response, which makes them difficult to be used for fabricating high pixel density, x-y matrix addressable passive image sensors. An "x-y" matrix is a two dimensional array with a first set of electrodes perpendicular to a second set of electrodes. When passive devices such as resistors, diodes or liquid crystal cells are used as the pixel elements at the intersection points, the matrix is often called a "passive" matrix (in contrast to an "active" matrix in which active devices, such as thin film transistors, are used to control the turn-on for each pixel).

To effectively address each pixel from the column and row electrodes in a passive matrix, the pixel elements must exhibit strongly nonlinear current-voltage ("I-V") characteristics or an I-V dependence with a threshold voltage. This requirement provides the foundation for using light-emitting diodes or liquid crystal cells to construct passive x-y addressable displays. However, since the photoresponse of inorganic photodiodes is voltage-independent in reverse bias, photodiodes made with inorganic semiconductor crystals are not practical for use in high pixel-density, passive image sensors—there is too much cross-talk between pixels. To avoid cross-talk, existing two dimensional photodiode arrays made with inorganic photodiodes must be fabricated with each pixel wired up individually, a laborious and costly procedure. In the case of such individual connections, the number of input/output leads is proportional to the number of the pixels. The number of pixels in commercial two dimensional photodiode arrays is therefore limited to $\leq 16 \times 16 = 256$ due to the difficulties in manufacturing and in making inter-board connections. Representative commercial photodiode arrays include the Siemens KOM2108 5×5 photodiode array, and the Hamamatsu S3805 16×16 Si photodiode array.

The development of CCDs provided an additional approach toward high pixel density, two-dimensional image sensors. CCD arrays are integrated devices. They are different than x-y addressable passive matrix arrays. The operating principle of CCDs involves serial transfer of charges from pixel to pixel. These interpixel transfers occur repeatedly and result in the charge migrated, eventually, to the edge of the array for read-out. These devices employ super-large integrating circuit ("SLIC") technology and require an extremely high level of perfection during their fabrication. This makes CCD arrays costly (~$10^3$–$10^4$ for a CCD of 0.75"–1" size) and limits commercial CCD products to sub-inch dimensions.

The thin film transistor ("TFT") technology on glass or quartz substrates, which was developed originally for the needs of liquid crystal displays, can provide active-matrix substrates for fabricating large size, x-y addressable image sensors. A large size, full color image sensor made with amorphous silicon (a-Si) p-i-n photocells on a-Si TFT panels was demonstrated recently [R. A. Street, J. Wu, R. Weisfield, S. E. Nelson and P. Nylen, Spring Meeting of Materials Research Society, San Francisco, Apr. 17–21 (1995); J. Yorkston et al., Mat. Res. Soc. Sym. Proc. 116, 258 (1992); R. A. Street, Bulletin of Materials Research Society 11(17), 20 (1992); L. E. Antonuk and R. A. Street, U.S. Pat. No. 5,262,649 (1993); R. A. Street, U.S. Pat. No 5,164,809 (1992)]. Independently, a parallel effort on small size, active-pixel photosensors based on CMOS technology on silicon wafers has been re-activated following developments in the CMOS technology with submicron resolution [For a review of recent progress, see: Eric J. Lerner, Laser Focus World 32(12) 54, 1996]. This CMOS technology allows the photocells to be integrated with the driver and the timing circuits so that a mono-chip image camera can be realized.

CCDs, a-Si TFTs, and active-pixel CMOS image sensors represent the existing/emerging technologies for solid state image sensors. However, because of the costly processes involved in fabrication of these sophisticated devices, their applications are severely limited. Furthermore, the use of SLIC technologies in the fabrication processes limit the commercial CCDs and the active-pixel CMOS sensors to sub-inch device dimensions.

Photodiodes made with organic semiconductors represent a novel class of photosensors with promising process advantages. Although there were early reports, in the 1980s, of fabricating photodiodes with organic molecules and conjugated polymers, relatively small photoresponse was observed [for an review of early work on organic photodiodes. see: G. A. Chamberlain, Solar Cells 8, 47 (1983)]. In the 1990s, there has been progress using conjugated polymers as the active materials; see for example the following reports on the photoresponse in poly(phenylene vinylene), PPV, and its derivatives,: S. Karg, W. Riess, V. Dyakonov, M. Schwoerer, Synth. Metals 54, 427 (1993); H. Antoniadis, B. R. Hsieh, M. A. Abkowitz, S. A. Jenekhe, M. Stolka, Synth. Metals 64, 265 (1994); G. Yu, C. Zhang, A. J. Heeger, Appl. Phys. Lett. 64,1540 (1994); R. N. Marks, J. J. M. Halls, D. D. D. C. Bradley, R. H. Frield, A. B. Holmes, J. Phys.: Condens. Matter 6, 1379 (1994); R. H. Friend, A. B. Homes, D. D. C. Bradley, R. N. Marks, U.S. Pat. No. 5,523,555 (1996)]. Recent progress has demonstrated that the photosensitivity in organic photodiodes can be enhanced under reverse bias. A photosensitivity of ~90 mA/Watt was observed in ITO/MEH-PPV/Ca thin film devices at 10 V reverse bias (430 nm), corresponding to a quantum efficiency of >20% el/ph [G. Yu, C. Zhang and A. J. Heeger, Appl. Phys. Lett. 64, 1540 (1994); A. J. Heeger and G. Yu, U.S. Pat. No. 5,504,323 (Apr. 2, 1996)]. In photodiodes fabricated with poly(3-octylthiophene), photosensitivity over 0.3 A/Watt was observed over most of the visible spectral range at –15 V bias [G. Yu, H. Pakbaz and A. J. Heeger, Appl. Phys. Lett. 64, 3422 (1994)].

The photosensitivity in organic semiconductors can be enhanced by excited-state charge transfer; for example, by sensitizing the semiconducting polymer with acceptors such as $C_{60}$ or its derivatives [N. S. Sariciftci and A. J. Heeger, U.S. Pat. No. 5,331,183 (Jul. 19, 1994); N. S. Sariciftci and A. J. Heeger, U.S. Pat. No. 5,454,880 (Oct. 3, 1995); N. S. Sariciftci, L. Smilowitz, A. J. Heeger and F. Wudl, Science 258, 1474 (1992); L. Smilowitz, N. S. Sariciftci, R. Wu, C. Gettinger, A. J. Heeger and F. Wudl, Phys. Rev. B 47, 13835 (1993); N. S. Sariciftci and A. J. Heeger, Intern. J. Mod. Phys. B 8, 237 (1994)]. Photoinduced charge transfer prevents early time recombination and stabilizes the charge separation, thereby enhancing the carrier quantum yield for subsequent collection [B. Kraabel, C. H. Lee. D. McBranch, D. Moses, N. S. Sariciftci and A. J. Heeger, Chem. Phys. Lett. 213, 389(1993); B. Kraabel. D. McBranch, N. S. Sariciftci, D. Moses and A. J. Heeger, Phys. Rev. B 50, 18543 (1994); C. H. Lee, G. Yu, D. Moses, K. Pakbaz, C. Zhang, N. S. Sariciftci, A. J. Heeger and F. Wudl, Phys. Rev. B. 48, 15425 (1993)]. By using charge transfer blends as the photosensitive materials in photodiodes, external photosensitivity of 0.2–0.3 A/W and external quantum yields of 50–80% el/ph have been achieved at 430 nm at low reverse bias voltages [G. Yu, J. Gao, J. C. Hummelen, F. Wudl and A. J. Heeger, Science 270, 1789 (1995); G. Yu and A. J. Heeger, J. Appl. Phys. 78, 4510(1995); J. J. M. Halls, C. A. Walsh, N. C. Greenham, E. A. Marseglia, R. H. Frield, S. C. Moratti and A. B. Holmes, Nature 376, 498 (1995)]. At the same wavelength, the photosensitivity of the UV-enhanced silicon photodiodes is ~0.2 A/Watt, independent of bias voltage [S. M. Sze, Physics of Semiconductor Devices (Wiley, New York, 1981) Part 5]. Thus, the photosensitivity of thin film photodiodes made with polymer charge transfer blends is comparable to that of photodiodes made with inorganic semiconducting crystals. In addition to their high photosensitivity, these organic photodiodes show large dynamic range; relatively flat photosensitivity has been reported from 100 mW/cm$^2$ down to nW/cm$^2$; i.e., over eight orders of magnitude [G. Yu, H. Pakbaz and A. J. Heeger, Appl. Phys. Lett. 64, 3422 (1994); G. Yu, J. Gao, J. C. Hummelen, F. Wudl and A. J. Heeger, Science 270, 1789 (1995); G. Yu and A. J. Heeger, J. Appl. Phys. 78, 4510 (1995)]. The polymer photodetectors can be operated at room temperature, and the photosensitivity is relatively insensitive to the operating temperature, dropping by only a factor of 2 from room temperature to 80 K [G. Yu, K. Pakbaz and A. J. Heeger, Appl. Phys. Lett. 64, 3422 (1994)].

As is the case for polymer light-emitting devices [G. Gustafsson, Y. Cao, G. M. Treacy, F. Klavetter, N. Colaneri, and A. J. Heeger, Nature 357, 477 (1992); A. J. Heeger and J. Long, Optics & Photonics News, Aug. 1996, p.24], high sensitivity polymer photodetectors can be fabricated in large areas by processing from solution at room temperature, they can be made in unusual shapes (e.g. on a hemisphere to couple with an optical component or an optical system), or they can be made in flexible or foldable forms. The processing advantages also enable one to fabricate the photosensors directly onto optical fibers. Similarly, organic photodiodes can be hybridized with optical devices or electronic devices, such as an integrated circuits on a silicon wafer. These unique features make organic photodiodes special for many novel applications.

SUMMARY OF THE INVENTION

We have now found a new application for the enhancement of photosensitivity in organic photodiodes by applying a reverse bias.

We have now found that this variable photosensitivity enables an on-off voltage-switchable photosensors. At a reverse bias, typically greater than 1 V and more typically in the range of 2–15 V, the photodiode can be switched on with photosensitivity above 1 mA/W and particularly 10–500 mA/W or of 30–300 mA/W. The photosensitivity at a voltage close to the internal (built-in) potential is several orders of magnitude lower, equivalent to zero at the output of a 8–16 bit digital read-out circuit. This near zero state can thus be defined as the off state of the photodiode.

These voltage-switchable, organic photodiodes can serve as individual pixels in passive diode arrays. These arrays can be in the form of x-y addressable arrays with anodes connected via row (column) electrodes and cathodes connected via column (row) electrodes. Every pixel can be selected, and the information (intensity of the incident light) at each pixel can be read out without crosstalk.

These arrays can utilize the processing advantages associated with the fabrication of organic diode structures from soluble, semiconducting, conjugated polymers (and/or their precursor polymers). Layers of these materials can be cast from solution to enable the fabrication of large active areas, onto substrates with desired shapes. This also enables active areas to be in flexible form. These photoactive materials can be patterned onto an optically uniform substrate by means of photolithography, microcontact printing, shadow masking and the like. For the photosensors for visible light sensing applications, the substrate can be opaque for $\lambda<400$ nm so that the pixels are insensitive to UV radiation.

The photoactive layer employed in these switchable photodiodes is made up of organic materials. These take numerous forms. They can be conjugated semiconducting polymers and blends of polymers including such materials. Donor-acceptor blends, with conjugated polymers serving as the donor and polymeric and monomeric acceptors can also be used as can molecular donors and acceptors (i.e. molecules rather than macromolecules) well known in the art. Examples of the latter include anthracene and its derivatives, pinacyanol and its derivatives thiophene oligomers (such as sexithiophene.6T, and octylthiophene, 8T) and their derivatives and the like, phenyl oligomers (such as sexiphenyl or octylphenyl) and the like. In addition, one can employ multiple layers of organic semiconducting materials in donor/acceptor heterojunction configurations. In addition, one can employ multiple layers of organic semiconducting materials in donor/acceptor, heterojunction configurations.

The organic image sensors enabled by this invention can have mono-color or multi-color detection capability. In these image sensors color selection can be achieved by combining a suitable color filter panel with the organic image sensors and image sensor arrays already described. If desired, the color filter panel can serve as a substrate upon which the image sensor is carried.

In addition, embodiments of the present invention provide organic image sensors with full-color detection capability. In these organic image sensors, a filter panel is made up of red, green and blue color filters which are patterned in a format corresponding to the format of a photodiode array. The panel of patterned filters and the patterned photodiode array are coupled (and coordinated) such that a colored image sensor is formed. The patterned color filter panel can be used directly as the substrate of the image sensor.

Full-color detectivity, is also achieved when red, green and blue are detected by three of these photodiodes with spectral response cut-off at 500 nm, 600 nm and 700 nm, respectively. Differentiation operations in the read-out circuit extract the red (600–700 nm), green (500–600 nm) and blue (400–500 nm) signals.

In addition to be used in their intrinsic response spectral ranges (typically between 200 nm–1000 nm), these organic photodiodes can be used for photosensing in other spectral ranges such as in ultraviolet (UV), in X-ray and in infrared (IR) spectra. The photosensing of photon energies at other than their intrinsic spectral ranges can be achieved via techniques of energy down or up conversion For example, photosensing in UV and X-ray spectral ranges can be achieved with a phosphor layer or a scintillation layer placed betwen the UV or X ray source and the photosensor. The layer will convert the high energy radiation into visible emission which is detected be the organic photosensors. IR radiation and high energy particle radiation can be detected following similar principles.

These organic photosensors are also sensitive intrinsically to radiation at specific wavelengths in deep UV and X-ray spectral ranges. These wavelengths and their corresponding photon energies are related to optical transitions from inner core levels (energy bands) to the lowest unoccupied molecular orbital (LUMO) or the bottom of the conduction band.

BRIEF DESCRIPTION OF THE DRAWINGS

This invention will be further described with reference being made to the drawings in which.

DESCRIPTION OF PREFERRED EMBODIMENTS

Figure 1:
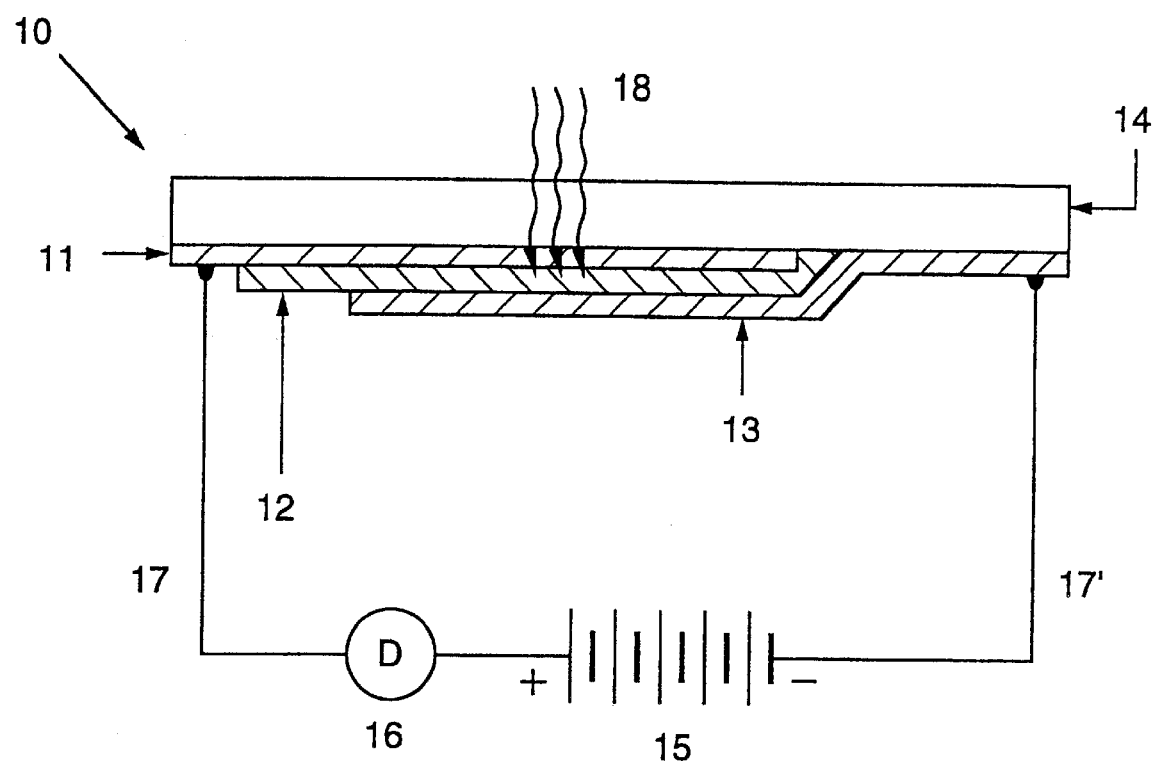
FIG. 1 is a cross-sectional schematic view of a voltage-switchable photodiode of this invention 10 assembled into a circuit. The photocurrent can be read out by an current meter inserted in the loop.

This invention provides high sensitivity photodiodes with voltage-switchable photosensitivity; the photosensitivity can be switched on and off by the application of selected voltages, thereby reducing cross-talk between pixels in an array of such voltage switchable photodiodes to acceptable levels. These switchable photosensors enable the fabrication of two-dimensional (2D), passive image sensors with column-row (x-y) addressability. The voltage-switchable photodetector is constructed in a metal-semiconductor-metal (M-S-M) thin film structure in which an organic film such as a film of semiconducting polymer or a polymer blend is used as the photo-active material. Selected-color or multi-color detection in the visible and near UV can be achieved by coupling the image sensor to an optical filter(s). Fabrication processes for red, green and blue (R,G,B) and full-color image sensors are described by coupling the x-y addressable polymer diode matrix with a RGB (red, green, blue) color filter panel, or by fabricating photodiodes with cut-off of the photoresponse at 500 nm, 600 nm and 700 nm, respectively, onto optically uniform substrates.

Visible-blind or solar blind UV detection can be achieved by using photoactive materials with an optical gap >3.1 eV (wavelength <400 nm), or by combining an organic photosensor with a smaller energy gap with a UV bandpass optical filter which is opaque in the visible. In addition to photosensing in the visible and in the UV range (200 nm–400 nm), photosensing in other spectral ranges such as in deep UV, in X-ray and in IR can be achieved by combining the organic photosensor with a phosphor layer or a scintillation layer. The high energy radiation or the IR radiation can be converted into visible radiation and then detected by the organic photodetector. Radiation at specific wavelengths in deep UV and X-ray spectral ranges can also be detected directly with these organic photodiodes. These wavelengths are corresponding to the optical transitions from inner core levels (energy bands) to the lowest unoccupied molecular orbital (LUMO) or the bottom of the conduction band.

Voltage-switchable photodiodes make possible 2D image sensors. Using such photodiodes as the sensing elements in a column-row matrix, a 2D x-y addressable, passive image sensor can be constructed which operates without crosstalk. Because of the strong voltage dependence of the photosensitivity, a column of pixels in the 2D photodiode matrix can be selected and turned on with proper voltage bias, leaving the rest of the pixels on other rows insensitive to the incident light. With this type of operation, the physical M row, N column 2D matrix is reduced to N isolated linear diode arrays each with M elements; said isolated linear diode arrays are free from the crosstalk which originates from finite resistance between devices on different columns. With such 2D, passive photodiode arrays, an image can be read out with a pulse train scanning through each column of the matrix. Since the number of contact electrodes are reduced to N+M in the x-y addressable matrix, compared to N×M in the case of individual connection, large size, high pixel density, 2D image arrays become practical (comparable to the high pixel density display arrays made with LCD technology). For example for a 1000 by 1000 pixel array, the present invention reduces the number or required electrodes by 500 times. The polymer image sensor matrix thus provides an unique approach to fabricating large size, low cost, high pixel density, 2D image sensing arrays with room temperature or low temperature manufacturing processes.

As demonstrated in the examples herein, the spectral response of the polymer image sensors can cover the entire visible spectrum with relatively flat response. A portion of the visible spectrum can also be selected with a band-pass or low-pass optical filter. Multi-color detection in the visible and the near UV can be achieved by coupling the image sensor with a color-filter panel. A fabrication process for full-color image sensors is described with the x-y addressable polymer diode matrix and a RGB (red, green, blue) color filter panel.

DEFINITIONS AND DEVICE STRUCTURES

In this description of preferred embodiments and in the claims, reference will be made to several defined terms. One group of terms concerns the structure of the voltage-switchable photodiode. A cross-sectiona view of the voltage-switchable photodiode is shown in FIG. 1. The voltage-switchable photodiode 10 is constructed using the metal-semiconductor-metal (M-S-M) thin film device configuration. Specifically, the device 10 includes:

A "photo layer" (layer 12) comprised of organic, semiconducting material(s), such as a conjugated polymer, a polymer blend, a polymer/molecule polyblend, a layer of organic molecule or molecular blends; or a multilayer structure combining the above materials;

Two "contact electrodes" (layers 11, 13) which serve as the anode and cathode of the photodiodes to extract electrons and holes, respectively, from the photoactive layer. One of the electrodes (layer 11 in FIG. 1) is made transparent or semitransparent to allow the incident light 18 to be absorbed in the active layer (12).

The "anode" electrode is defined as a conducting material with higher work function than the "cathode" material.

This same relationship electrodes 11 and 13 to active layer 12 and light source 18 (or 18') is found in devices 10, 20, 30 40 and 50 as depicted in FIGS. 1, 2, 3, 4, and 5, respectively.

Figure 2:
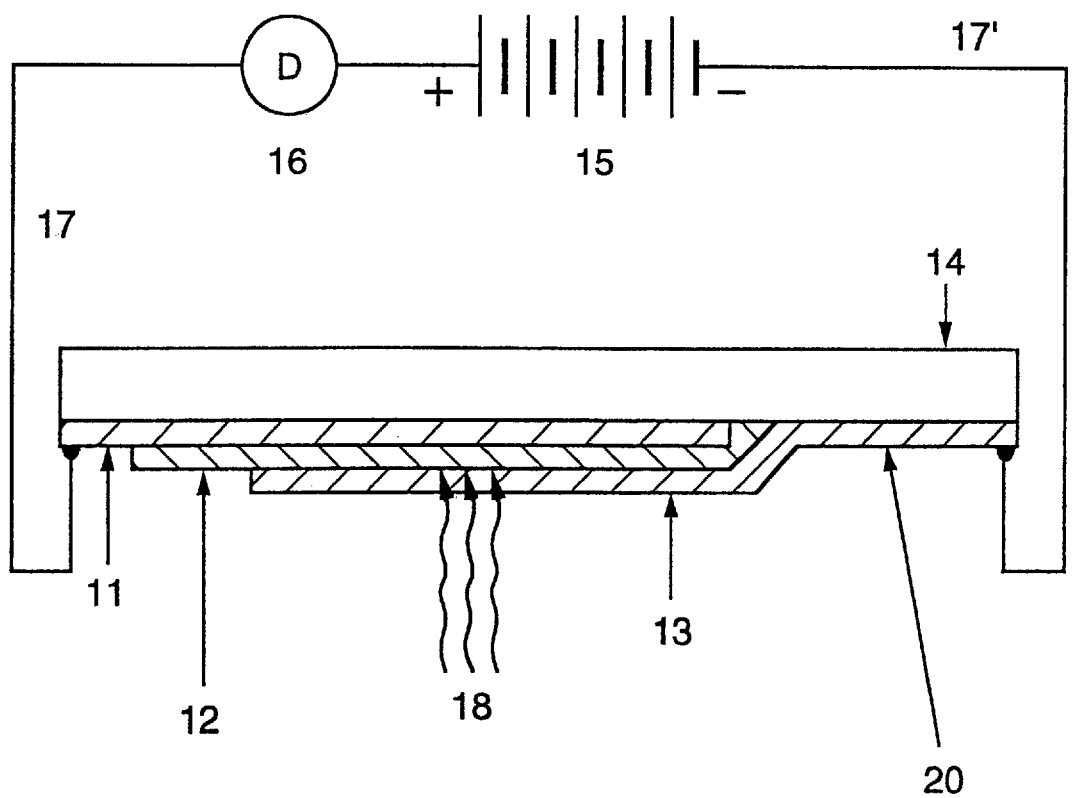
FIG. 2 is a cross-sectional schematic view of a voltage-switchable photodiode 20 in reversed configuration, in which the reversed configuration refers the structure with the transparent electrode contacted with the free surface of the active layer.

As shown in FIGS. 1 and 2, electrodes 11 and 13 are connected to bias voltage source 15 via lines 17 and 17', respectively. Detector 16 is wired in series into this circuit to measure the photoresponse generated in the photodiode in response to light 18. This same circuit would be employed in all of the devices (10, 20, 30, 40 and 50) depicted in FIGS. 1–5.

The devices may also include an optional substrate or support 14, as shown in FIGS. 1–5. This is a solid, rigid or flexible layer designed to provide robustness to the diodes and/or to the matrix array of diodes. When light is incident from the substrate side, the substrate should be transparent or semitransparent. Glass, polymer sheets or flexible plastic films are substrates commonly used. Wide band semiconductor wafers (such as SiC, SiN) which are transparent below their optical gaps can also be used in some applications. In these cases, a thin, doped region can also serve as the contact electrode 11.

Devices with the inverted geometry shown in FIG. 2 are also useful in applications. In this configuration, light 18 is incident from the "back" electrode side, and optically opaque materials can be used as the substrate material. For example, by using an inorganic semiconductor wafer (such as silicon) as the substrate 14, and by doping the semiconductor to "conductive" levels (as defined in the following), the wafer can serve both as the substrate 14 and the contact electrode 11. The inverted structure offers the advantage of integrating the photosensor with driving/read-out circuitry built directly onto the inorganic semiconductor substrate (using integrated circuit technology).

The incident light 18 (or 18') is defined generally so as to include wavelengths in visible (400–700 nm), wavelengths in the ultraviolet (100–400 nm) and wavelengths in the infrared (700–2000 nm). As noted, other wavelengths can be used, if appropriate.

Several layers are designated as "transparent" or "semi-transparent". These terms are used to refer to the property of a material which transmits a substantial portion of the incident light incident on it. The term "transparent" is used to describe a substrate with transmittance over 50% and the term "semi-transparent" is used to describe a substrate with transmittance between 50% to 5%.

A "conductive" layer or material has a conductivity typically larger than 0.1 S/cm. A semiconducting material has conductivity of from $10^{-14}$ to $10^{-1}$ S/cm.

The "positive" (or "negative") bias refers to the cases when higher potential is applied to the anode electrode (cathode electrode). When values of negative voltage are referred to, as in the case of the reverse bias voltages applied to obtain enhanced photosensitivity, the relative values will be stated in terms of absolute values; that is, for example, a −10 V (reverse) bias is greater than a −5 V (reverse) bias.

Figure 3:
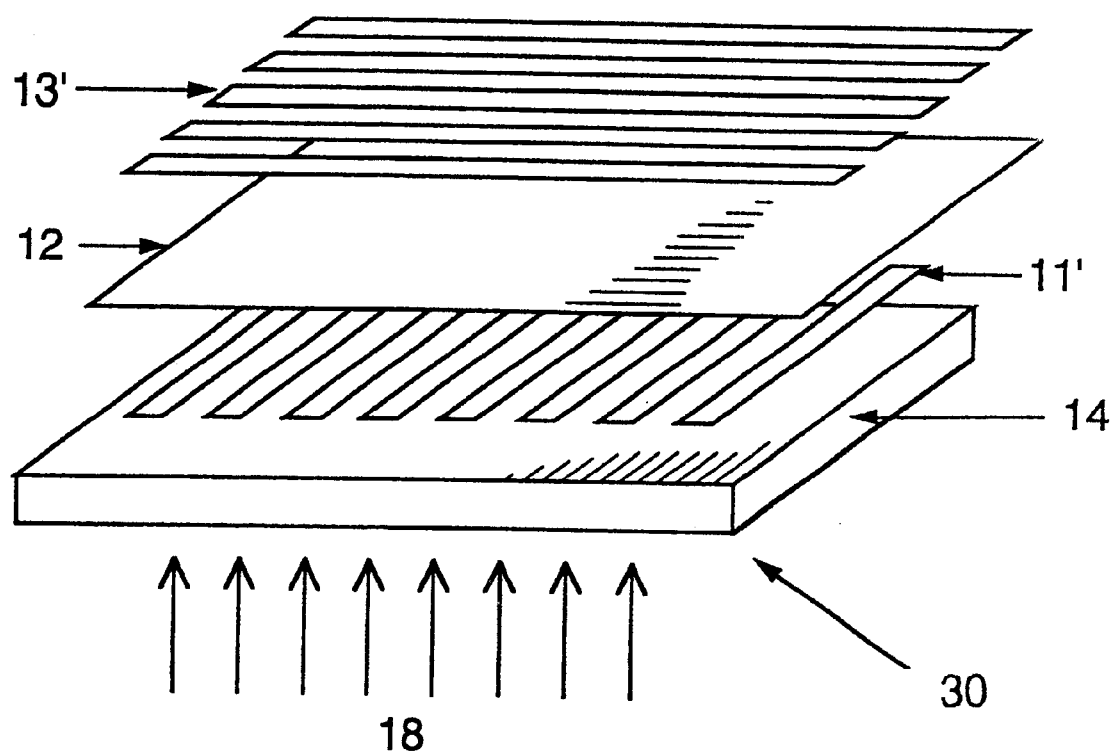
FIG. 3 is an exploded schematic view of a 2D image sensor 30 made of an x-y addressable, passive matrix of voltage-switchable photodiodes.
Figure 4:
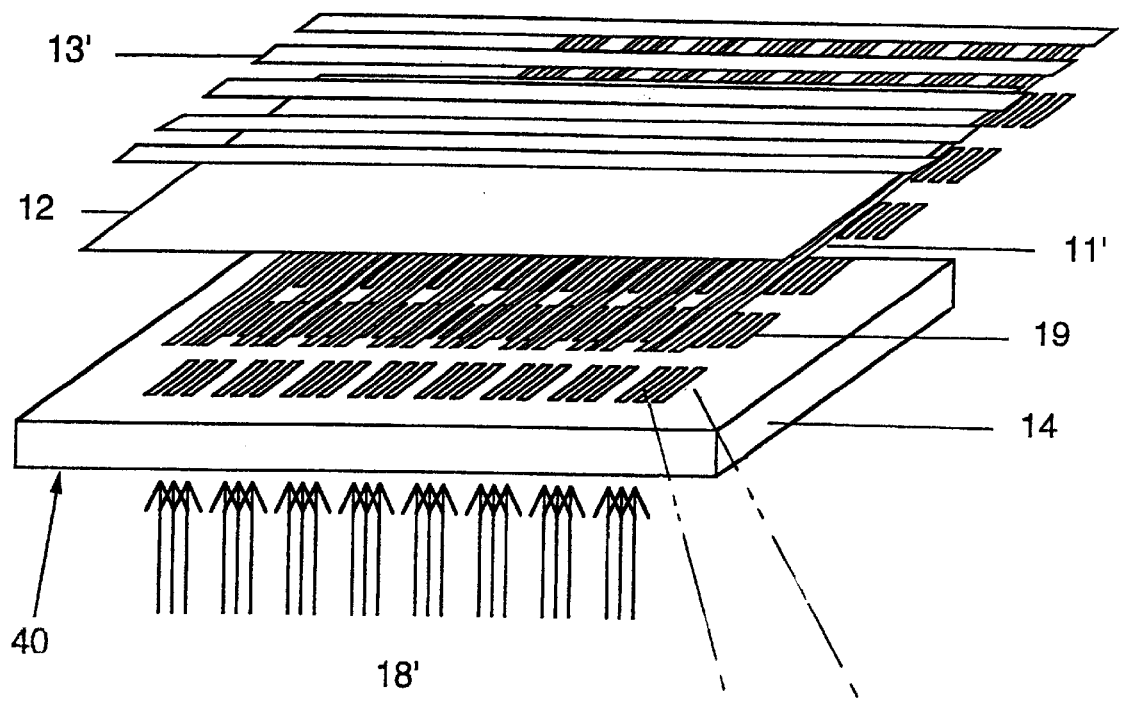
FIG. 4 is an exploded schematic view of a full-color image sensor 40 made with an x-y addressable photodiode matrix coupled to a color filter panel.
Figure 4A:
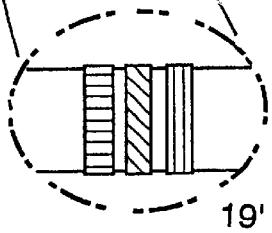

The structure of the x-y addressable, passive photodiode matrix (2D image sensor 30) is depicted in FIG. 3. Shown in FIG. 4 is the structure of a full-color image sensor 40 made with the x-y addressable photodiode matrix. In these devices, the anode and cathode electrodes 11', 13' are typically patterned into rows and columns perpendicular to one another. In certain applications, patterning of the photoactive layer 12 is not necessary. Each intersection of the row and column electrodes defines a photosensitive element (pixel) with device structure similar to that shown in FIG. 1 or FIG. 2. The widths of the row and column electrodes 11', 13' define the active area of each pixel.

A matrix of color filters 19 (each pixel of the color filter is comprised of red, green and blue color filters 19') is coupled with the photodiode panel. A separate sheet of color filters similar to that used for color-LCD displays [For a review, see: M. Tani and T. Sugiura, Proceeding of SID, Orlando, Fla. (1994)] can be used for this purpose. In a more preferred embodiment, the color-filter panel can be coated directly onto the substrate for the photodiode matrix. The set of transparent electrodes 11 (for example, made of indium-tin-oxide, ITO) can be fabricated over the color filter coating. In this configuration, high pixel densities with micron-size feature size can be achieved.

Figure 5:
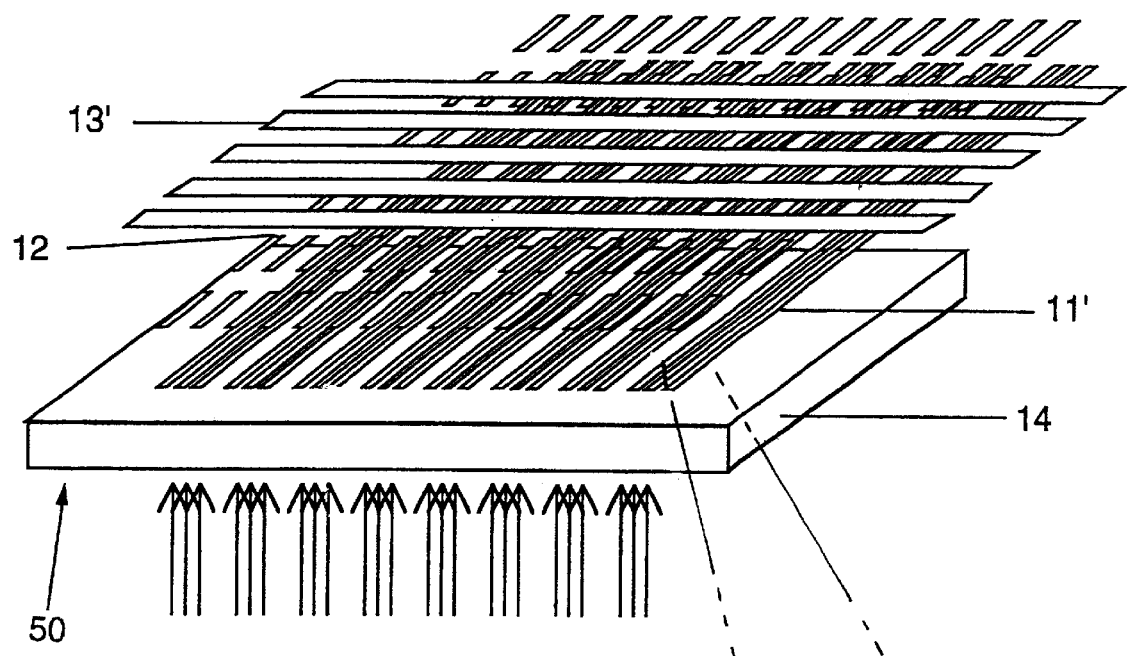
FIG. 5 is an exploded schematic view of a full-color image sensor 50 made with an x-y addressable photodiode matrix of which each full-color pixel is made of three photosensitive materials having differing long-wavelength cut-offs such as at 700 nm, 600 nm and 500 nm.
Figure 5A:
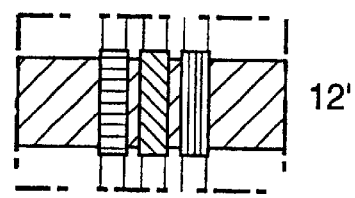

Full-color detection can be achieved with an alternative approach 50 as shown in FIG. 5. In this approach, each full-color pixel 12' comprises three photodiodes 12R, 12G and 12B with long wavelength cut-offs at 700, 600 and 500 nm, respectively. These photodiodes are made of three photosensitive materials in the defined areas on the substrate. The patterning of the active layers can be achieved by photolithography, screen printing, shadow masking and the like. The correct red, green and blue color information can be obtained by differentiation of the signals (in the read-out circuit) from the three sub-pixels, 12R, 12G and 12B, as demonstrated in the examples of this invention. An optically uniform material is used as the substrate which is transparent in the visible and opaque in UV.

The Photoactive Layer

The photoactive layer 12 in the voltage-switchable photodiodes is made of a thin sheet of organic semiconducting material. The active layer can comprise one or more semiconducting, conjugated polymers, alone or in combination with non-conjugated materials, one or more organic molecules, or oligomers. The active layer can be a blend of two or more conjugated polymers with similar or different electron affinities and different electronic energy gaps. The active layer can be a blend of two or more organic molecules with similar or different electron affinities and different electronic energy gaps. The active layer can be a blend of conjugated polymers and organic molecules with similar or different electron affinities and different energy gaps. The latter offers specific advantages in that the different electron affinities of the components can lead to photoinduced charge transfer and charge separation; a phenomenon which enhances the photosensitivity [N. S. Sariciftci and A. J. Heeger, U.S. Pat. No. 5,333,183 (Jul. 19, 1994); N. S. Sariciftci and A. J. Heeger, U.S. Pat. No. 5,454,880 (Oct. 3, 1995); N. S. Sariciftci, L. Smilowitz, A. J. Heeger and F. Wudl, Science 258, 1474 (1992); L. Smilowitz, N. S. Sariciftci, R. Wu, C. Gettinger, A. J. Heeger and F. Wudl, Phys. Rev. B 47, 13835 (1993); N. S. Sariciftci and A. J. Heeger, Intern. J. Mod. Phys. B 8, 237 (1994)]. The active layer can also be a series of heterojunctions utilizing layers of organic materials or blends as indicated above.

The thin films of organic molecules, oligomers and molecular blends can be fabricated with thermal evaporation, chemical vapor deposition (CVD) and so on. Thin films of conjugated polymers, polymer/polymer blends, polymer/oligomer and polymer/molecule blends can often be fabricated by casting directly from solution in common solvents or using similar fluid phase processing. When polymers or polyblends are used as the active layer, the devices can be fabricated onto flexible substrates yielding unique, mechanically flexible photosensors.

Examples of typical semiconducting conjugated polymers include, but are not limited to, polyacetylene, ("PA"), and its derivatives; polyisothianaphene and its derivatives; polythiophene, ("PT"), and its derivatives; polypyrrole, ("PPr"), and its derivatives; poly(2,5-thienylenevinylene), ("PTV"), and its derivatives; poly(p-phenylene), ("PPP"), and its derivatives; polyflourene, ("PF"), and its derivatives; poly(phenylene vinylene), ("PPV"), and its derivatives; polycarbazole and its derivatives; poly(1,6-heptadiyne); polyquinolene and semiconducting polyanilines (i.e. leucoemeraldine and/or the emeraldine base form). Representative polyaniline materials are described in U.S. Pat. 5,196,144 which is incorporated herein by reference. Of these materials, those which exhibit solubility in organic solvents are preferred because of their processing advantages.

Examples of PPV derivatives which are soluble in common organic solvents include poly(2-methoxy-5-(2'-ethyl-hexyloxy)-1,4-phenylene vinylene), ("MEH-PPV") [F. Wudl, P.-M. Allemand, G. Srdanov, Z. Ni and D. McBranch, in Materials for Nonlinear Optics: Chemical Perspectives, edited by S. R. Marder, J. E. Sohn and G.D. Stucky (The American Chemical Society, Washington DC, 1991), p. 683.], poly(2-butyl-5-(2-ethyl-hexyl)-1,4-phenylenevinylene), ("BuEH-PPV") [M. A. Andersson, G. Yu, A. J. Heeger, Synth. Metals 85, 1275 (1997)], poly(2,5-bis(cholestanoxy)-1,4-phenylenevinylene), ("BCHA-PPV") [see U.S. patent application Ser. No. 07/800,555, incorporated herein by reference] and the like. Examples of soluble PTs include poly(3-alkylthiophenes), ("P3AT"), wherein the alkyl side chains contain more than 4 carbons, such as from 5 to 30 carbons.

Organic image sensors can be fabricated using donor/acceptor polyblends as the photoactive layer. These polyblends can be blends of semiconducting polymer/polymer, or blends of semiconducting polymer with suitable organic molecules. Examples for the donor of the donor/acceptor polyblends include but are not limited to the conjugated polymers just mentioned, that is PPV, PT, PTV, and poly(phenylene), and their soluble derivatives. Examples for the acceptors of the donor/acceptor polyblends include but are not limited to poly(cyanaophenylenevinylene) ("CN-PPV") and its derivatives, fullerene molecules such as $C_{60}$ and its functional derivatives, and organic molecules used heretofore in the art for photoreceptors.

One can also produce photoactive layers using two semiconducting organic layers in a donor/acceptor heterojunction structure. In these structures, the donor layer is typically a conjugated polymer layer and the acceptor layer is made up of poly(cyanaophenylenevinylene) ("CN-PPV"), fullerene molecules such as $C_{60}$ and its functional derivatives such as PCBM and PCBCR, or organic molecules used heretofore in the art for photoreceptors. Examples of this heterojunction layer structure for a photoactive layer include but are not limited to, PPV/$C_{60}$, MEH-PPV/$C_{60}$, PT/$C_{60}$, P3AT/$C_{60}$, MEH-PPV/$C_{60}$, and so on.

The active layer can also be made of wide band polymers such as poly-N-vinylcarbazole ("PVK") doped with dye molecule(s) to enhance the photosensitivity in visible spectral range. In these cases, the wide band organic serves as both host binder as well as hole (or electron) transport material. Examples include, but are not limited to, PVK/o-chloranil, PVK/rhodamine B and PVK/coronene and the like.

The photoactive layer can employ organic molecules, oligomers or molecular blends as the photoactive layer. In this embodiment, the photosensitive material can be fabricated into thin films by chemical vapor deposition, molecular epitaxy or other known film-deposition technologies. Examples of suitable materials include but are not limited to anthracene, phthalocyanine, 6-thiophene, ("6T"), triphenylene and its derivatives such as 2,3,6,7,10,11-hexahexylthiotriphenylene, or molecular blends such as 6T/$C_{60}$, 6T/pinacyanol, phthalocyanine/o-chloranil and the like. The photoactive layer can also be a multilayer structure combining the above materials.

Examples of organic molecules, oligomers and molecular blends can be used for the active layer include anthracene and its derivatives, tetracene and its derivatives, phthalocyanine and its derivatives, pinacyanol and its derivatives, fullerene ("$C_{60}$") and its derivatives, thiophene oligomers (such as sixethiophene "6T" and octithiophene "8T") and their derivatives and the like, phenyl oligomers (such as sixephenyl or octiphenyl) and their derivatives and the like, $6T/C_{60}$, 6T/pinacyanol, phthalocyanine/o-chloranil, anthracene/$C_{60}$, anthracene/o-chloranil and the like.

In some embodiments, the active layer 12 comprises one or more organic additives (which are optically non-active) to modify and to improve the device performance. Examples of the additive molecules include anionic surfactants such as ether sulfates with a common structure,

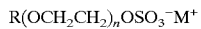

wherein R represents alkyl alkyllaryl, $M^+$ represents proton, metal or ammonium counterion, n is moles of ethylene oxide typically n=2–40).

Application of such anionic surfactants as additives for improving the performance of polymer light-emitting diodes has been demonstrated by Y. Cao [U.S. patent application, Ser. No. 08/888,316, which is incorporated by reference].

Other types of additives include solid state electrolytes or organic salts. Examples include poly(ethylene oxide), lithium trifluoromethanesulfonate, or their blends, tetrabutylammonium dodecylbenzenesulfonate and the like. Application of such electrolyte to luminescent polymers and invention of new type of light-emitting devices have been demonstrated by Q. Pei and F. Klavetter [U.S. patent application, Ser. No. 08/268,763].

In cases where the active layer is made of organic blends with two or more phases with different electron affinities and optical energy gaps, nanoscale phase separation commonly occurs, and heterojunctions form at the interfacial area. The phase(s) with higher electron affinity acts as an electron acceptor(s) while the phases with lower electron affinity (or lower ionization energy serves as an electron donor(s). These organic blends form a class of charge-transfer materials, and enable the photo-initiated charge separation process defined by the following steps [N. S. Sariciftci and A. J. Heeger, Intern. J. Mod. Phys. B 8, 237 (1994)]:

Step 1: $D+A \rightarrow {}^{1,3}D^*+A$, (excitation on D);

Step 2: ${}^{1,3}D^*+A \rightarrow {}^{1,3}(D\_A)^*$, (excitation delocalized on D-A complex);

Step 3: ${}^{1,3}(D\_A)^* \rightarrow {}^{1,3}(D^{\delta-}\_A^{\delta-})^*$, (charge transfer initiated);

Step 4: ${}^{1,3}(D^{67}\_A^{\delta-})^* \rightarrow {}^{1,3}(D^{+\cdot}\_A^{-\cdot})$, (ion radical pair formed);

Step 5: ${}^{1,3}(D^{+\cdot}\_A^{-\cdot}) \rightarrow D^{+\cdot}+A^{-\cdot}$, (charge separation)

where (D) denotes the organic donor and (A) denotes the organic acceptor; 1,3 denote singlet or triplet excited states, respectively.

Typical thickness of the active layer range from a few hundred Ångstrom units to a few thousand Ångstrom units; i.e., 300–5000 Å (1 Ångstrom unit=$10^{-8}$ cm). Although the active film thicknesses are not critical, device performance can typically be improved by using thinner films with optical densities of less than two in the spectral region of interest.

Electrodes

As shown in FIGS. 1 and 2, the organic photodiodes of this invention are constructed in an M-S-M structure, in which the organic photo-active layer is bounded on two sides with conductive contact electrodes. In the configuration shown in FIG. 1, a transparent substrate 14 and a transparent electrode 11 are used as one contact electrode. Indium-tin-oxides ("ITO") can be used as the electrode 11. Other transparent electrode materials include aluminum doped zinc oxides ("AZO"), aluminum doped tin-oxides ("ATO"), tin-oxides and the like. These conducting coatings are made of doped metal-oxide compounds which are transparent from near UV to mid-infrared.

The electrode 11 in FIG. 1 (or 13 in FIG. 2) can be formed of a conductive polymer such as polyaniline in the emeraldine salt form prepared using the counterion-induced processability technology disclosed in U.S. Pat. No. 5,232,631 and in Appl. Phys. Lett. 60, 2711 (1992) or other suitable techniques. The polyaniline film which serves as the electrode can be cast from solution with high uniformity at room temperature. The organic conducting electrodes in combination with polymer substrates and organic active layers allow these photosensors be fabricated in fully flexible form. Other conductive polymers can be used for the transparent or semitransparent electrode (11 in FIG. 1 or 13 in FIG. 2) include polyethylene dioxythiophene polystyrene sulfonate, ("PEDT/PSS") [Y. Cao, G. Yu, C. Zhang, R. Menon and A. J. Heeger, Synth. Metals, 87, 171 (1997)], poly(pyrrole) doped with dodecylbenzene sulfonic acid ("DBSA") [J. Gao, A. J. Heeger, J. Y. Lee and C. Y. Kim, Synth. Metals 82, 221 (1996)] and the like.

A thin semitransparent layer of metals (such as Au, Ag, Al, In etc.) can also be used as the electrode 11 in FIG. 1 and 13 in FIG. 2. Typical thicknesses for this semitransparent metal electrode are in the range of 50–500 Å, with optical transmittance between 80% and 10%. A proper dielectric coating (often in the form of multilayer dielectric stacks) can enhance the transparency in the spectral range of interest [For examples, see S. M. Sze, Physics of Semiconductor Devices (John Wiley & Sons, New York, 1981) Chapter 13].

The "back" electrode 13 in FIG. 1 (and 11 in FIG. 2) is typically made of a metal, such as Ca, Sm, Y, Mg, Al, In, Cu, Ag, Au and so on. Metal alloys can also be used as the electrode materials. These metal electrodes can be fabricated by, for example, thermal evaporation, electron beam evaporation, sputtering, chemical vapor deposition, melting process or other technologies. The thickness of the electrode 13 in FIG. 1 (and 11 in FIG. 2) is not critical and can be from hundreds of Ångstroms to hundreds of microns or thicker. The thickness can be controlled to achieve a desired surface conductivity.

When desired, for example, for a photodiode with detectivity on both front and back side, the transparent and semi-transparent materials described above can also be used as the "back" electrode 13 in FIG. 1 (and 11 in FIG. 2).

The patterning of the row and column electrodes shown in FIG. 3 and FIG. 4 can be achieved by standard patterning technologies well-known in semiconductor industry such as shadow masking, photolithographing, silk-screen printing or stamping (microcontact) printing etc. These methods are well known to those knowledgeable of the art of display technologies.

Color Filter Coating

In some applications, multicolor detection or selected color detection are of interest. These can be achieved by properly selecting the material for the photo-active layer along with coupling the photosensor with a color filter coating.

One type of application is a photosensor with selected spectral response, for example, from 500 to 600 nm. One effective approach is taking an organic photodiode with low energy cut-off at 600 nm (for example, a photodiode made with MEH-PPV), and placing a long-wavelength-pass optical filter (with cut-off at 500 nm) in front. The spectral response of semiconducting oligomers and polymers can be controlled by modifying the side chain or main chain structures. For example, by varying the side chain of the PPV system, the optical gap can be tuned from 500 nm to 700 nm. An alternative approach to achieving bandpass selection is to place a bandpass optical filter in front of an organic photodiode with wider spectral response.

In photoimaging applications, full-color detection is frequently of interest. This can be achieved by splitting a sensor element (pixel) into three subpixels with response to red (600–700 nm), green (500–600 nm) and blue (400–500 nm) (R,G,B) spectral regions (as shown in FIG. 4) respectively, similar to that commonly used in liquid crystal display (LCD) color-display technologies.

A simple but effective approach to full-color image sensors is sketched in FIG. 4. In this approach, the photodiode matrix is made of single sheet of active layer without patterning. The active areas are defined by the row and column electrodes. The spectral response of these organic photodiodes should cover the entire visible region (400–700 nm). Color selection is achieved by the color filter panel in front of the transparent electrodes. There are many organic materials or blends with photoresponse covering the entire visible spectrum. Examples include PT derivatives such as "P3OT", poly(3-(4-octylphenyl)thiophene) [M. R. Andersson, D. Selese, H. Jarvinen, T. Hjertberg, O. Inganas, O. Wennerstrom and J. E. Osterholm, Macromolecules 27, 6503 (1994)], PTV and its derivatives and the like.

Several color filter techniques have been developed and have been used broadly in color displays made with liquid crystal technologies, including dyeing, pigment-dispersed, printing and electro-deposition [M. Tani and T. Sugiura, Digest of SID 94 (Orlando, Fla.)]. Another approach uses multilayer dielectric coating based on optical interference. Because of better stability, pigment dispersion has become the major process used in large-scale manufacturing. Color filter panels with designed patterns, often in arrangements in triangular, striped (similar to that shown in FIG. 4), or diagonal mosaics, with transparent electrode coating (such as ITO) are existing art and are commercially available to the display industry. This type of substrate can be used in the fabrication of full-color image sensors shown in FIG. 4.

The photodetectors provided by the present invention can be adapted to respond to various types of ionized particles in addition to photons, themselves. This can be accomplished by incorporating in the photodetector structure a scintillating material adapted to emit photons in response to ionized particles. This material can be present in admixture with the active layer, it can be present as a separate layer or it can be present as part of the substrate or the transparent electrode. In one example this scintillating material is a phosphor, present, for example as a phosphor layer.

Examples of ionized particles which may be detected with devices of this structure are high energy photons, electrons, X-rays and ionized particles are characteristic of X-rays, beta particles and ionized particles are characteristic of gamma radiation. Radiation at specific wavelengths in deep UV and X-ray spectral ranges can also be detected directly with these organic photodiodes. These wavelengths are corresponding to the optical transitions from inner core levels (energy bands) to the lowest unoccupied molecular orbital (LUMO) or the bottom of the conduction band.

Radiation in IR region for photon energy less than the optical absorption gap of the photoactive material(s) can be achieved in similar manner by means of a phosphor layer which can convert low energy IR photons into higher energy visible photons.

APPLICATIONS OF THE INVENTION

The invention of voltage-switchable organic photodiodes provides the foundation for fabrication of large size, low cost 2D image sensors based on x-y addressable passive diode matrix. This type of photodiode shows high photosensitivity (typically in the range of 30–300 mA/W) at a given reverse bias and shows virtually zero response at a bias voltage close to the built-in potential. Thus, a row of pixels in a column-row matrix of such photodiodes can be selected by setting the selected row at reverse bias and the pixels on the other row biased at a voltage close to the built-in potential. In this way, crosstalk from pixels in different rows is eliminated. The image information at the pixels in the selected row can be read-out correctly in both the serial mode or the parallel mode. The information on the pixels in the other rows can be read-out in sequence or in selected fashion by setting the row of interest to reverse bias. The x-y addressable organic photodiode matrices provide a new type of 2D image sensor which can be made in large size, with low fabrication cost, onto substrates in desired shape or flexible, and hybridizable with other optical or electronic devices.

For linear diode arrays, the anodes (or the cathodes) of the diodes can be connected as the common electrode. The traditional expression is "common anode" or "common cathode".

For the common anode, the common anode is connected to a fixed voltage level in the readout circuit (for instance, at zero volts). The cathode of each diode is connected to the readout circuit at voltage level either Von (such as +10 V) or Voff (such as −0.2V, or 0V). When the cathode is biased with a positive voltage (higher potential level than the anode of the same diode), the diode is in reverse bias.

For the case of common cathode, the common cathode is connected to a fixed voltage level in the readout circuit (for instance, at zero volts). The anode of each diode is connected to the readout circuit at voltage level either Von (such as −10 V) or Voff (such as +0.2V, or 0V). When anode is biased with a negative voltage (lower potential level than the cathode of the same diode), the diode is in reverse bias.

The readout circuit is often connected at the common electrode at the fixed potential level (such as at zero volts).

For the case of 2D matrices. when column electrodes are scanned through, the row electrodes are connected to a given voltage level (such as 0V). The selected column is biased at Von and the rest are selected at the Voff. The readout circuits are located at the row electrodes (with fixed potential level such as 0V). In this driving scheme, there is no electrode disconnected from driving circuits (i.e., no electrode is floating). Each diode on the selected column (only one column is selected at one time so that there is no mixing of the image signal from different pixels at the readout circuits) experiences Von while the diodes on the unselected diodes rest at Voff. The anode electrode of each diode can be connected either to the row electrodes or the column electrodes.

Specific advantages of this invention over the prior art include the following:

(i) Organic photosensors with switchable photosensitivity. High photosensitivity can be switched on (typically in the range of 30–300 mA/W) at a selected reverse biasing voltage. The photosensitivity can be switched off effectively when the diode is biased externally at a voltage closed to that corresponding to the internal potential.

(ii) 2D, x-y addressable, passive image sensors fabricated with the organic photodiodes with switchable photosensitivity. Crosstalk-free read-out can be achieved with these passive image sensors by means of proper electronic pulse sequences.

(iii) Multi-color detection and full-color image sensing can be achieved by coupling the image matrix with a color filter panel or by fabricating the image sensor matrix directly onto a color filter panel.

(iv) Organic photodetector arrays in combination with other known advantages which characterize devices made with organic materials such as soluble conjugated polymers (ease in fabrication into large areas and desired shapes on rigid or flexible substrates, room temperature processing, ease in hybridization with optical, electro-optical, opto-electric or electric devices) offer promise for large size, low cost, high pixel density, 2D image sensors for use in office automation, in industrial automation, in biomedical devices and in consumer electronics.

EXAMPLES

Example 1

Voltage-switchable photodiodes were fabricated by evaporating a 5000 Å calcium contact (13) on the front of a thin MEH-PPV film 12 which was spin-cast from solution onto a ITO/glass substrate 14. The glass substrate had been previously partially coated with a contact layer 11 of indium-tin-oxide (ITO). The active area of each device was 0.1 cm$^2$. The MEH-PPV film was cast from a 0.5% (10 mg/2 ml) xylene solution at room temperature. Details on the synthesis of MEH-PPV can be found in literature [F. Wudl, P. M. Allemand, G. Srdanov, Z. Ni, and D. McBranch, in Materials for Nonlinear Optics:Chemical Perspectives, Ed. S. R. Marder, J. E. Sohn and G. D. Stucky (American Chemical Society, Washington, DC. 1991) p. 683]. The thickness of the active layer was adjusted by varying the concentration of the solution, by varying the spin speed of the spinner head and by applying multiple coating layers.

Electrical data were obtained with a Keithley 236 Source-Measure Unit. The excitation source was a tungsten-halogen lamp filtered with a bandpass filter (center wavelength of 430 nm, bandwidth of 100 nm) and collimated to form a homogeneous 5 mm×10 mm area of illumination. The maximum optical power at the sample was 20 mW/cm$^2$ as measured by a calibrated power meter. A set of neutral density filters were used for measurements of intensity dependence.

Figure 6:
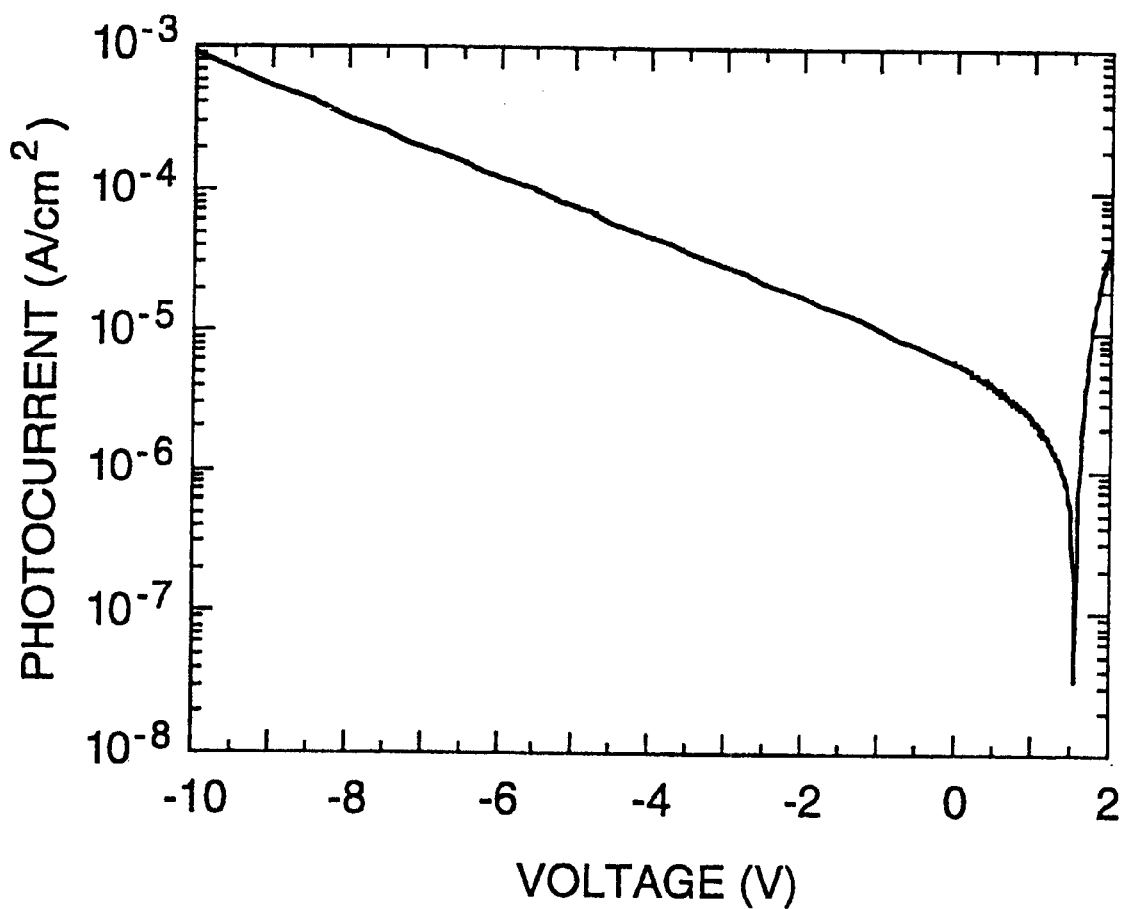
FIG. 6 is a graph of the photocurrent as a function of bias voltage in a ITO/MEH-PPV/Ca device.

FIG. 6 shows the magnitude of the photocurrent (absolute value) as a function of bias voltage under 20 mW/cm$^2$ illumination at 430 nm. The photocurrent at 1.5 V bias was ~3×10$^{-8}$ A/cm$^2$, increasing to 9×10$^{-4}$ A/cm$^2$ at −10V reverse bias corresponding to a photosensitivity of 45 mA/W and a quantum efficiency of 13% el/ph. The ratio of the photosensitivity between the two bias voltages was 3×10$^4$, thus the photosensitivity at 1.5 V bias was practically zero in the read-out circuit. This degree of difference enabled an analog-to-digital (A/D) convertor of 8–12 bit resolution.

The photoresponse increased nearly linearly with light intensity (I$^{0.92-1}$) over the entire range measured from nW/cm$^2$ to tens mW/cm$^2$. No signature of saturation was observed at 20 mW/cm$^2$ (the highest light intensity in the measurement).

Other metals such as Al, In, Cu, Ag and the like were also used for the counter electrode 13 (see FIG. 1) which is the cathode in these devices. Similar photosensitivities to that shown in FIG. 5 were observed in all these devices. The off-state voltage which balanced off the internal potential of the photodiode varied with the work function of the metal; the off-state voltage is determined by the work function difference between the metal cathode and the ITO anode. Table 1 lists the off-state voltage found for MEH-PPV photodiodes with several metal electrodes.

This example demonstrates that high photosensitivity can be achieved with MEH-PPV organic photodiodes under reverse bias. The desired photosensitivity can be achieved at a given reverse bias. The photosensitivity can be switched off at a proper bias voltage which is dependent on the electrode materials selected. As shown in Table 1, air stable metals with work functions over 4 V can be used for the electrodes in organic photodiodes. This example also demonstrates the broad dynamic range of the polymer photodiodes, a dynamic range which is sufficient to enable image detection with multi-grey levels.

TABLE 1

Off-state voltage in ITO/MEH-PPV/metal photodiodes

| Metal cathode | Ca | Sm | Yb | Al | In | Ag | Cu |
|---|---|---|---|---|---|---|---|
| V$_{off}$(V) | 1.5 | 1.5 | 1.5 | 1.1 | 0.9 | 0.7 | 0.4 |

Example 2

Devices of Example 1 were fabricated onto flexible ITO/PET substrates. The thickness of the PET sheets used as substrates was 5–7 mils (150–200 mm). Similar device performance was observed.

This example demonstrates that the voltage-switchable organic photodiodes can be fabricated in a thin structure, in flexible form, or in a desired shape to meet the special needs in specific applications.

Example 3

Devices of Example 1 were fabricated on glass and PET substrates. In these devices, the ITO anode 11 was replaced with organic conducting coatings or with ITO overcoated with conducting organic films. PANI-CSA and PEDT/PSS were used as the organic electrode. The PANI-CSA layers were spin-cast from m-cresol solution [details about preparation of the PANI solution and PANI-CSA film have been disclosed in U.S. Pat. No. 5,232,631]. The PEDT-PSS films were cast from an aqueous dispersion (1.3% W/W) which was supplied by Bayer [Bayer trial product, TP AI 4071], details about the synthesis can be found in the literature [G. Heywang and F. Jonas, Adv. Materials 4, 116 (1992)]. The cast films were then baked at 50–85° C. for several hours in a vacuum oven or in a N$_2$ dry box. In the case of PEDT/PSS, the films were finally baked at a temperature over 100° C. for several minutes to complete the drying process. The thickness of the conducting polymer electrodes was controlled from a few hundred Angstroms to a few thousand Angstroms.

Figure 7:
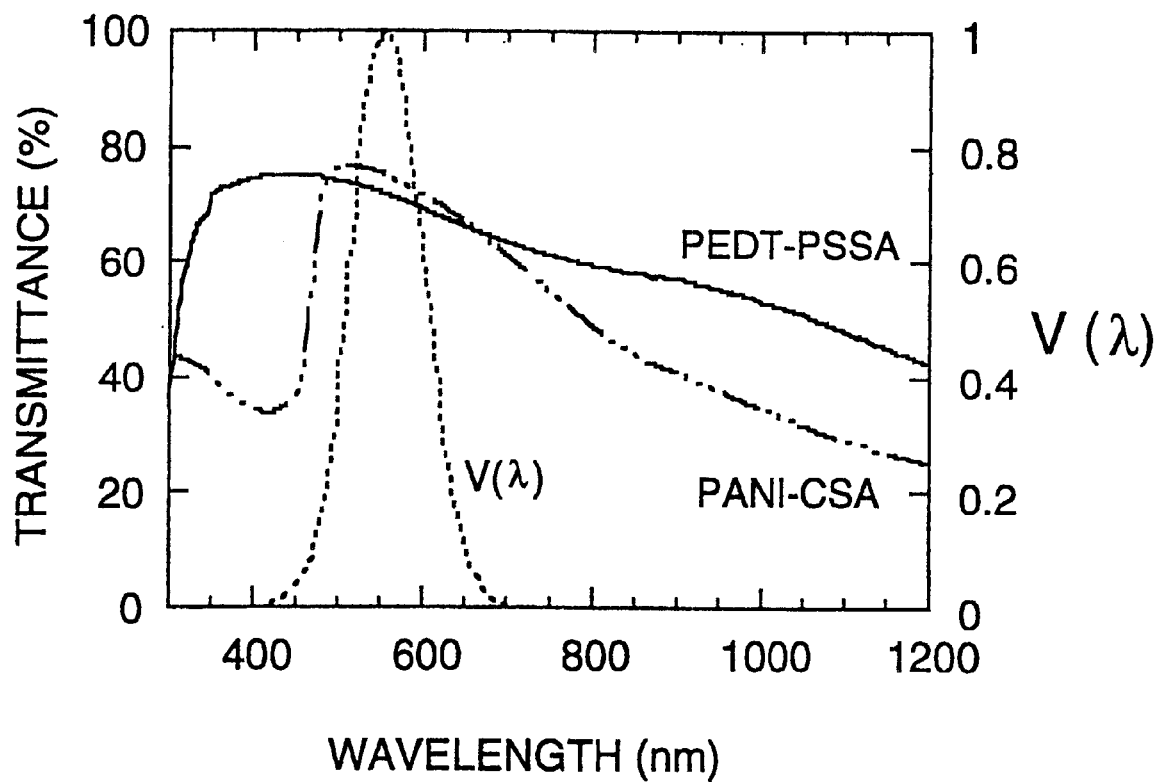
FIG. 7,is a graph of the transmission characteristics of PANI-CSA and PEDT-PSS conducting polymer electrodes; also shown is the visual response, $V(\lambda)$, of human eye.

The optical transmission spectra of the polymer anode electrodes are shown in FIG. 7, including data from PANI-CSA and PEDT-PSS. Also shown in FIG. 7 is the spectral response of the normal human eye, V(λ). The data indicate that these organic conducting electrodes can be used for photosensors for applications in visible spectral range. Moreover, the PEDT-PSS electrodes can also be used for ultraviolet (250–400 nm) and for near infrared. Thus, the polymer electrodes can be used in photosensors with full-color (white color or R,G,B three color) detection.

In addition to the electrodes made with PANI-CSA or PEDT-PSS alone, devices were fabricated with ITO/PANI-CSA and ITO/PEDT-PSS bilayer electrodes. In these cases, the polymer electrodes were cast in a thin layer (thickness of a few hundred Angstrom units) to maximize the optical transmission. Organic light-emitting devices with bilayer electrodes have demonstrated improved device performance such as carrier injection and device stability. Examples are shown in U.S. patent applications Ser. Nos. 08/205,519 and 08/609,113.

The photosensitivities of the devices with organic anode electrodes or bilayer electrodes were similar to those shown in FIG. 6; i.e. tens of mA/W at reverse bias voltage in the −5 to about −10 V range.

This example demonstrates that conducting polymer materials can be used as the electrode materials of the photodiodes and image sensors. These plastic electrode materials provide opportunity of fabricating organic photo-sensors in flexible or foldable forms. This example also demonstrates that the polymer electrode can be inserted between a metal-oxide transparent electrode (such as ITO) and the active layer to modify the interfacial properties and the device performance.

Example 4

Devices of Example 1 were repeated. A thin buffer layer was inserted between the ITO and the MEH-PPV layers to reduce the leakage current through pinhole imperfections in the active layer. The materials used for the buffer layer were PAZ, TPD (prepared via chemical vapor deposition) and PVK (cast from cyclohexanone solution). The thickness of the buffer layer was 100–500 Å. The photoresponse of these devices was similar to that shown in FIG. 6. However, in these devices, the dark current (which is caused frequently from microshorts-due to pinholes in the active layer) was reduced in magnitude. In these short-free devices, a photon flux as small as 10 nW/cm$^2$ was detected under direct current operation. The off-state voltage was 1.6~1.7 V in these devices, slightly higher than in the devices in Example 1.

This example demonstrates that a buffer layer can be inserted between the active layer and the contact electrode(s) to reduce device shorts and to improve the device response to weak light. This buffer layer can be made of organic molecules via chemical vapor deposition or polymeric materials through wet casting processes.

Example 5

Devices of Example 1 were repeated. The active material, MEH-PPV, was blended with an anionic surfactant Li-CO436 in molar ratios of 0, 1, 5, 10 and 20%. The Li-CO436 was synthesized by a substitution reaction from Alipal CO436 (ammonium salt nonylphenoxy ether sulfate) supplied by Phone-Poulenc Co. [Y. Cao, U.S. patent application Ser. No. 08/888,316]. Al was used as the cathode. The photosensitivity was enhanced in the devices with blended Li-CO436. For example, the photocurrent increased by a factor of 2 in a device made with MEH-PPV:Li-OC436 (10 wt %) compared with a similar device made without the Li-OC436. Moreover, the off-state voltage shifted from 1.1 V in ITO/MEH-PPV/Al devices (see Example 1) to 1.5 V in the ITO/MEH-PPV:Li-OC436 (20%)/Al devices. Similar effects were also observed in devices having an ITO/MEH-PPV/Li-OC436/Al structure.

This example demonstrates that organic additives can be added to the active layer or inserted between the active player and the contact electrode to modify the device performance including photosensitivity and off-state voltage.

Example 6

Voltage-switchable photodiodes were fabricated in the structure of ITO/MEH-PPV:PCBM/metal, similar to that shown in FIG. 1. The PCBM (a $C_{60}$ derivative) served as an acceptor in a donor-acceptor pair with the MEH-PPV acting as donor. The active area of these devices was ~0.1 cm$^2$. The blend solution was prepared by mixing 0.8% MEH-PPV and 2% PCBM/xylene solutions with 2:1 weight ratio. The solution was clear, uniform, and was processable at room temperature. Solutions were stored in a $N_2$ box for over 1.5 years and no aggregation or phase separation were observed. The active layer was spin-cast from the solution at 1000–2000 rpm. Typical film thicknesses were in the range of 1000–2000 Å. Ca, Al, Ag, Cu, and Au were used as the counter electrode 13. In each case, the film was deposited by vacuum evaporation with thickness of 1000–5000 Å.

Figure 8:
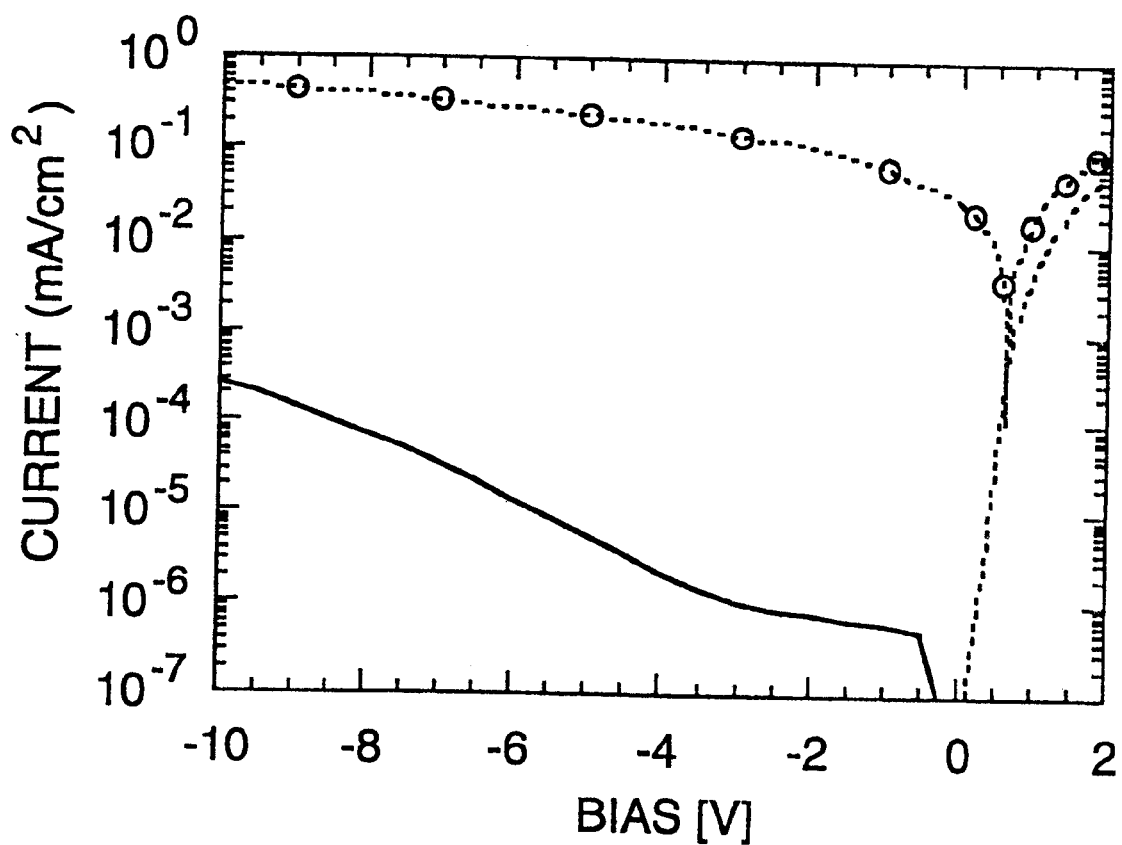
FIG. 8 is a graph of the photocurrent (circles) and the dark current (squares) of a ITO/MEH-PPV:PCBM/Al photodiode. The photocurrent was taken under white light of intensity ~10 mW/cm$^2$.

FIG. 8 shows the I-V characteristics of an ITO/MEH-PPV:PCBCR/Al device in the dark and under light illumination. The thickness of the blend film was ~2000 Å. The dark current saturated at ~1 nA/cm$^2$ below 3 V and then increased superlinearly at high bias voltages (>$E_g$/e). Zener tunneling can account for this effect. The photocurrent was measured The photocurrent at 0.65 V was ~×10$^{-7}$ A/cm$^2$, increasing to 5×10$^{-4}$ A/cm$^2$ at−10V bias. The on-off ratio was ~5000. Devices with thinner blend films showed improved photosensitivity and higher on-off ratio. Similar photosensitivity was also observed in devices fabricated with other metals as the counter electrodes. These included Ag, Cu, Ca, Sm, and Pb.

Other organic molecules were used as the photoacceptor, including $C_{60}$. Other mixtures were prepared using the $C_{60}$ derivative, PCBM. Higher photosensitivity was observed from MEH-PPV:PCBM processed from 1,2-dichlorobenzene solution. The photosensitivity reached 0.2 A/W at 430 nm when biased at −2 V.

This example demonstrates that the photosensitivity can be further improved by blending a donor polymer with a molecular acceptor such as $C_{60}$. High photosensitivity can be achieved at relatively low bias and low field (~$10^5$ V/cm). This example also demonstrates that the photosensitivity can be switched to nearly zero when bias the device at a voltage balancing the internal built-in potential (~0.65 V for Al cathode). The data in this example show that, due to its low dark current level, the polymer photodiode can be used to detect weak light down to an intensity level of tens of nW/cm$^2$. Thus, the polymer photodiodes have a dynamic range spanning more than six orders of magnitude, from nW/cm2 to 100 mW/cm$^2$.

Example 7

Devices similar to those of Example 6 were fabricated with glass/ITO and PET/ITO substrates in 4.5 cm×4 cm (18 cm$^2$) and in 3.8 cm×6.4 cm (24.3 cm$^2$) using a fabrication process similar to that of Example 6. I-V characteristics similar to that shown in FIG. 8 were observed. The photodiodes made with flexible PET substrates were bent into circular shapes any without change in their photosensitivity.

This example demonstrates that the high sensitivity, voltage-switchable photosensors can be fabricated in large sizes. With flexible PET substrates, the photosensors can be bent into desired shapes for special needs in optics, physics and biomedical fields.

Example 8

Devices similar to those of Example 6 were repeated with the active layer made of MEH-PPV:CN-PPV, a polyblend with two polymers as the donor and acceptor phases. Ca and ITO were used as the cathode and anode electrodes, respectively. Similar I-V characteristics to those shown in FIG. 8 were observed, while the off-state voltage shifted to ~1.2 V as anticipated from the change in the potential barrier between the donor and acceptor phases.

Example 9

Devices similar to those of Example 6 were repeated with the active layer made of sexithiophene (6T):PCBCR, a blend with two organic molecules as the donor and acceptor phases. Similar I-V characteristics were obtained to those shown in FIG. 8.

Examples 8 and 9 demonstrate that the active layer of the voltage-switchable photodiodes can be a blend of organic molecules, or a blend of conjugated polymers, in addition to a polymer/molecule blend as demonstrated in example 6. The data in these examples along with that in the Example 1 also demonstrate that, for a given cathode such as Ca, the off-state voltage varies with the electronic structure of the active material.

Example 10

Figure 9:
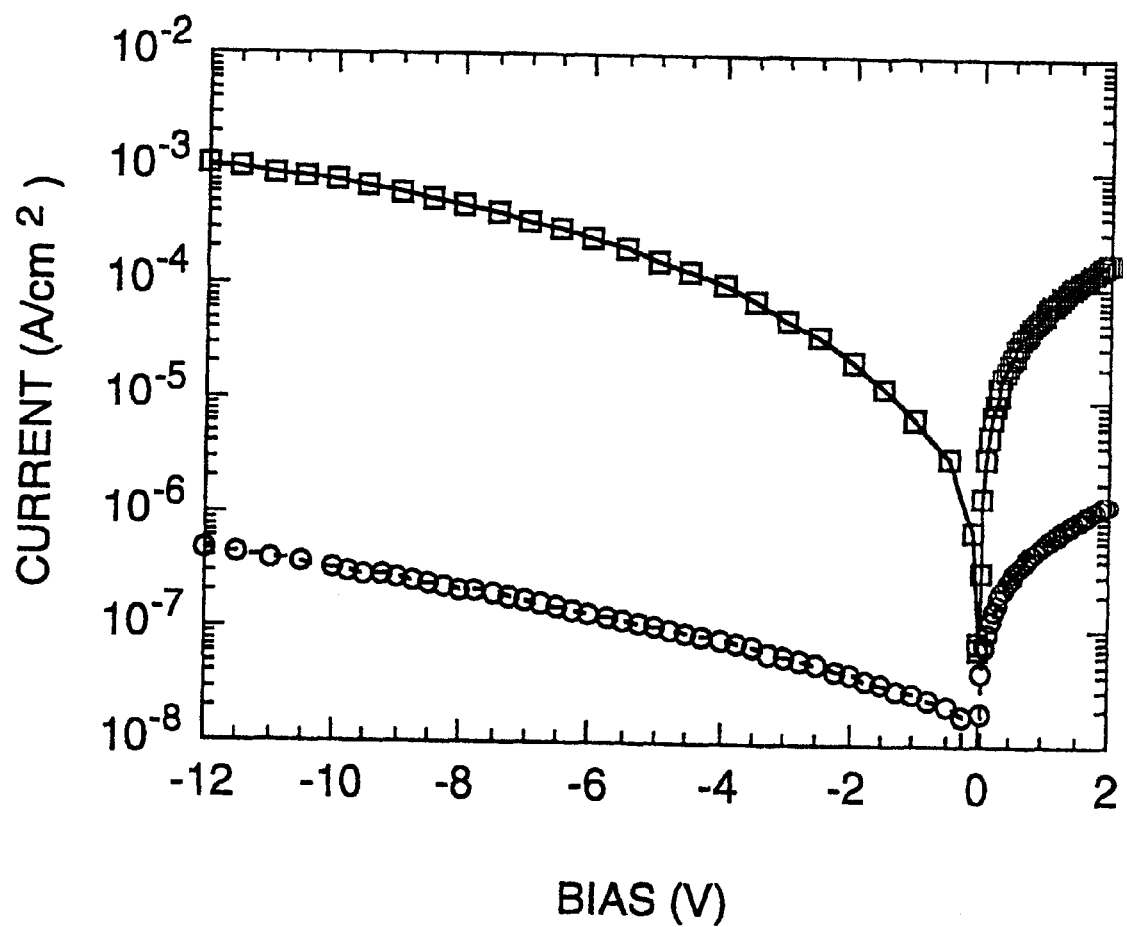
FIG. 9 is a graph of the current-voltage characteristics of an ITO/P3OT/Au photodiode in the dark (circles), and illuminated under ~10 mW/cm$^2$ at 633 nm (squares)

Voltage-switchable organic photodiodes was fabricated with P3OT as the active layer in an ITO/P3OT/Au structure. The I-V characteristics in the dark and under light illumination are shown in FIG. 9. Since the work function of Au is higher than ITO, the Au electrode serves as the anode in these devices. Positive bias was defined such that a higher potential was applied to Au electrode. Light was incident from the cathode (ITO) electrode. In this experiment, a He—Ne laser at 633 nm was used as the illumination source with a photon density of 10 mW/cm$^2$.

The built-in potential in this photodiode was reduced to nearly zero volts. Thus, the off-state of the photodiode was shifted to close to zero volts. The photocurrent at $-12$ V was 1 mA/cm$^2$, which was $10^4$ times higher than that at zero bias. Values of the ratio $I_{ph}(-12V)/I_{ph}(0)$ in excess of $1.5 \times 10^5$ have been realized in similar devices. The photosensitivity at 633 nm was ~100 mA/W, corresponding to a quantum efficiency of ~20% ph/el. The dark current in the test range was below $5 \times 10^{-7}$ A/cm$^2$. The photocurrrent/dark current ratio was greater than 1000 over a broad bias range ($-4$~$-12$ V).

This example demonstrates that the off-state of the photodiode can be varied by proper selection of the active material and the electrode materials. This voltage can be set to a voltage close to zero volts. A photodiode matrix fabricated with this type of photodiode can be driven by pulse trains with mono-polarity, thus simplifying the driving circuitry. The large on/off switching ratio and the large photocurrent/darkcurrent ratio permit the photodiodes to be used in the fabrication of x-y addressable passive matrices with high pixel density and with multiple-gray levels.

Example 11

Figure 10:
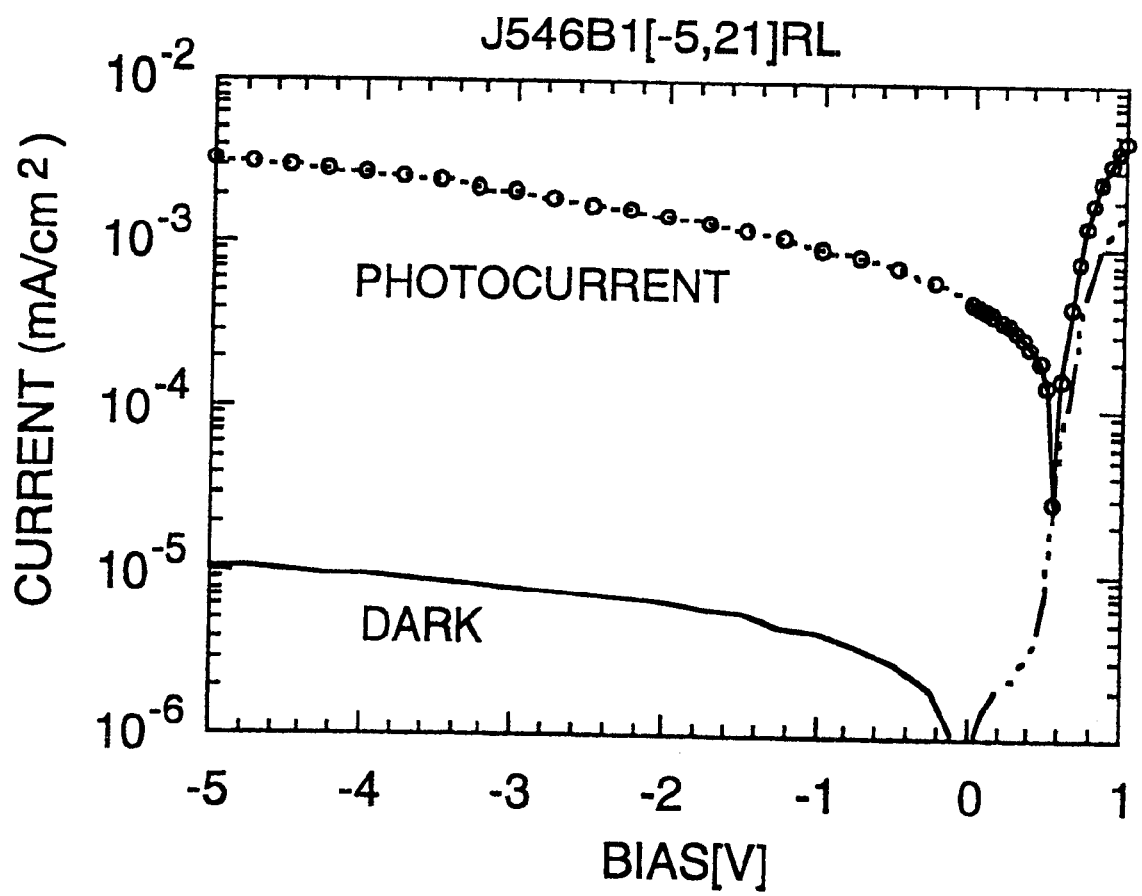
FIG. 10 is a graph of the I-V characteristics measured between a row electrode and a column electrode from a 7×40 photodiode matrix in the dark (lines) and under room light illumination (circles)

Two-dimensional, photodiode matrices were fabricated with seven rows and 40 columns. Pixel size was 0.7 mm×0.7 mm. The space between the row electrodes and the column electrodes was 1.27 mm (0.05"). The total active area was ~2"0.35". Typical I-V characteristics from a pixel are shown in FIG. 10. White light from a fluorescent lamp on the ceiling of the lab was used as the illumination source with intensity of ~tens of $\mu$W/cm$^2$. This is much weaker than the light intensity used in document scanners.

This example demonstrates that pixelated photodiode matrices can be fabricated without shorts and without crosstalk. This example also demonstrates that these devices can be used for applications with light intensities equal to or less than a microwatt/cm$^2$. Thus, polymer photodiode matrices are practical for image applications under relatively weak light conditions.

Example 12

Figure 11:
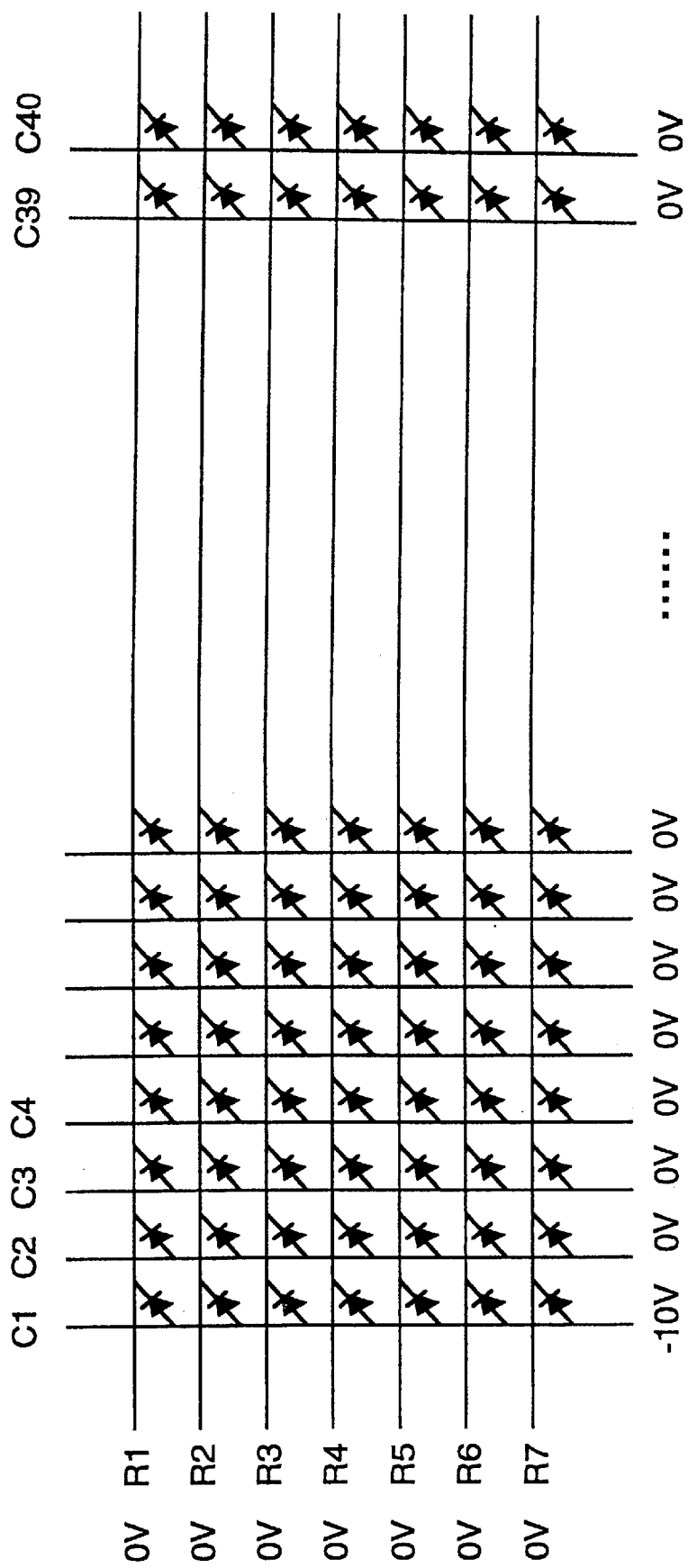
FIG. 11 is a schematic representation of the driving scheme for a 7×40 photodiode matrix. It will be described in terms of ITO/MEH-PPV:PCBM/Ag switchable photodiodes.

A scanning scheme for the photodiode matrix was developed (see FIG. 11). Due to the strong voltage dependence of the photosensitivity, a column of pixels in the 2D photodiode matrix could be selected and turned on with proper voltage bias, leaving the pixels in the adjacent rows insensitive to the incident light. Under such operation, the physical M row, N column 2D matrix is reduced to N isolated M element linear diode arrays which are free from crosstalk between columns. This is reminiscent of the concept that is used in solving a 2D integral by dimension reduction, $\int f(x,y)dxdy = \int g(x)dx \int h(y)dy$. With such 2D, passive photodiode arrays, an image can be read out with a pulse train scanning through each column of the matrix.

FIG. 11 shows a instantaneous "snap-shot" of the voltage distribution in a 7×40 photodiode matrix. At a specific time t, all the pixels were biased at +0.7 V except the pixels in column 1. The pixels in column 1 were all biased at $-10$ V so as to achieve high photosensitivity (tens-hundreds of mA/Watt). The information at each of the pixels in column 1 was read-out in both parallel (with N channel converting circuits and A/D converters) or serial (with N channel analog switches) sequences. Pixels in other columns were selected by switching the column bias from +0.7 V to $-10$ V in sequence. A digital shift register was used for the column-selection.

To simplify the driver circuit, it was preferable that the photosensor can be switched on and off between 0 V and a reverse bias voltage ($-2$ to $-10$ V). Such a mono-polarity, voltage switchable photodiode was demonstrated with ITO/P3OT/Au, as shown in Example 10.

Example 13

An image of multi-gray levels was selected, the image was scanned with the 7×40 photodiode matrix following the scanning scheme discussed in Example 12. The original image and the readout image were recorded photographically. The readout image reproduced the original image with excellent fidelity.

This example demonstrates that the voltage-switchable photodiodes can be used as the pixel elements of a column-row matrix such as is shown in FIG. 3. The photodiodes at each pixel can be addressed effectively from the column and row electrodes. Image information with multiple gray-levels can be read-out without distortion.

Example 14

Figure 12:
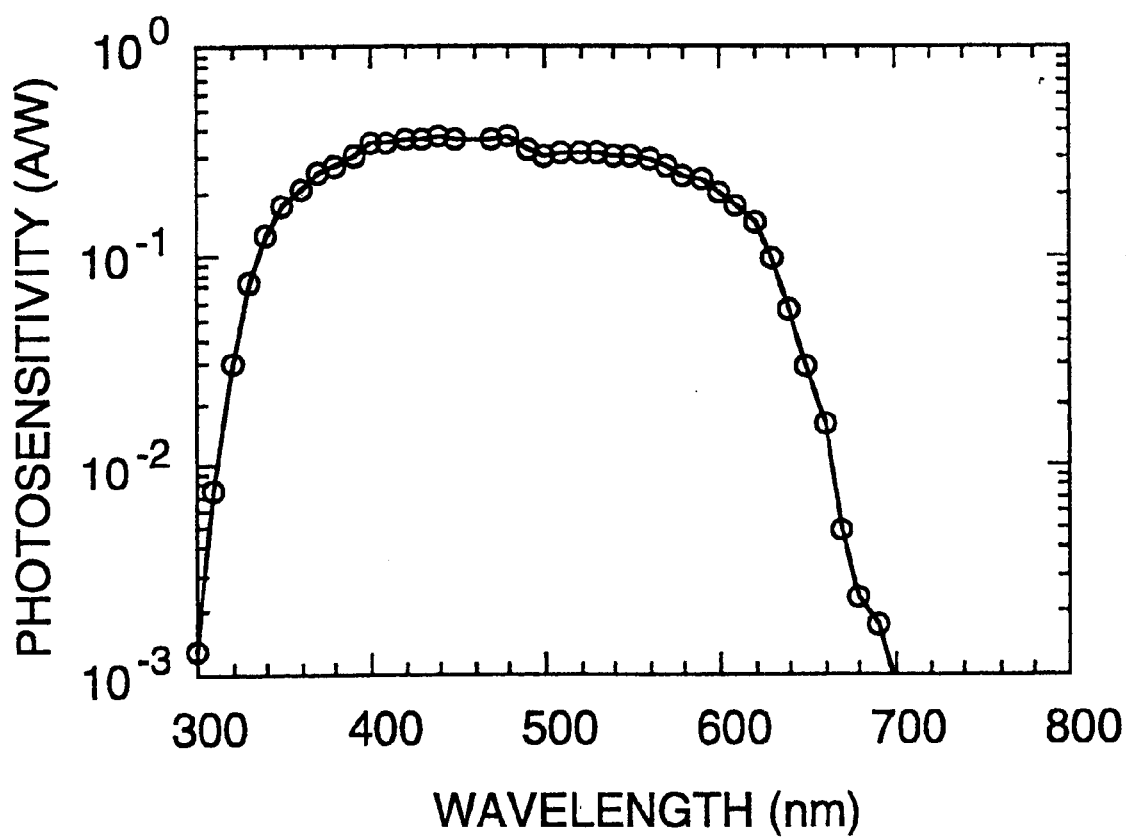
FIG. 12 is a graph of the photoresponse of a voltage-switchable photodiode made with P3OT.

Devices similar to those of Example 10 were fabricated and their spectral response was measured at a reverse bias of $-15$V. The data are shown in FIG. 12. In contrast to the significant sensitivity decrease at short wavelength in conventional inorganic photodiodes, the P3OT photodiodes exhibited relatively flat response for wavelengths shorter than 630 nm; the apparent decrease in sensitivity below 350 nm was mainly due to the transmission cut-off of the ITO coated glass substrate. For −15 V bias, the sensitivity at 540 nm reached 0.35 A/W (a quantum yield of ~80% el/ph), the same value as obtained with UV-enhanced Si diodes. Similar photosensitivity values persisted into the UV region below 400 nm.

This example demonstrates high photosensitivity organic photodiodes with response covering, simultaneously, the near UV and the entire visible spectra.

Example 15

Figure 13A:
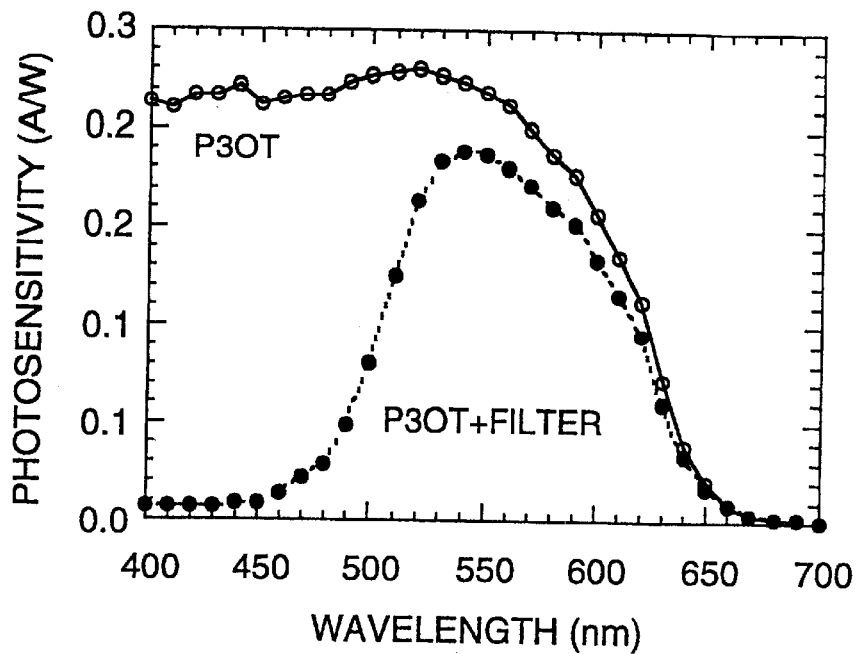
FIG. 13(a) is a graph of the photoresponse of voltage-switchable photodiodes with spectral response simulating that of human eye, $V(\lambda)$.
Figure 13B:
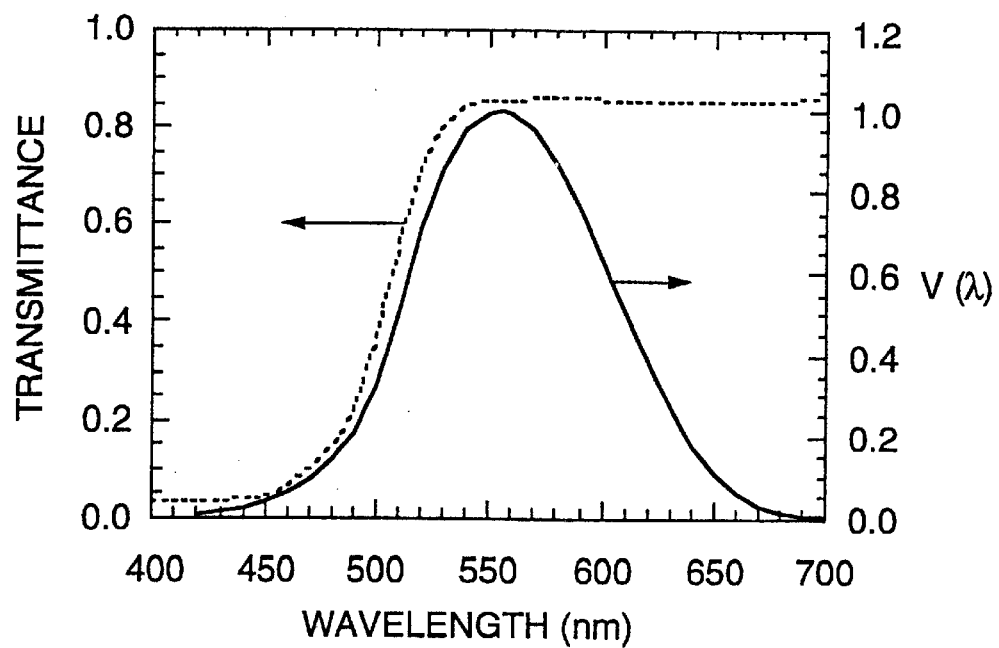
FIG. 13(b) is a graph of the transmittance of the long-wavelength-pass filter and the visual response, $V(\lambda)$ corresponding to FIG. 13(a)

Voltage-switchable photodiodes were fabricated to achieve a response similar to the visual response of the human eye, V(λ). The devices were fabricated by coating a long-wavelength-pass filter onto the front panel of the glass substrates of devices, similar to those shown in Example 15. The coating material in this example was a layer of PPV which was converted from its precursor film at 230° C. The photoresponses of the devices with and without the filter are shown in FIG. 13(a). The visual response of the human eye, V(λ) (see FIG. 13(b)), and the transmittance of the PPV optical filter are shown for comparison. The photoresponse of the P3OT diode closely coincided with V(λ) for wavelengths longer than 560 nm, while the optical transmittance of the PPV filter followed V(λ) over a broad range between 450 nm and 550 nm.

This example demonstrates a polymer photodetector with visual response essentially equivalent to V(λ), which is of great interest in optical engineering and biophysical/biomedical applications.

Example 16

Figure 14:
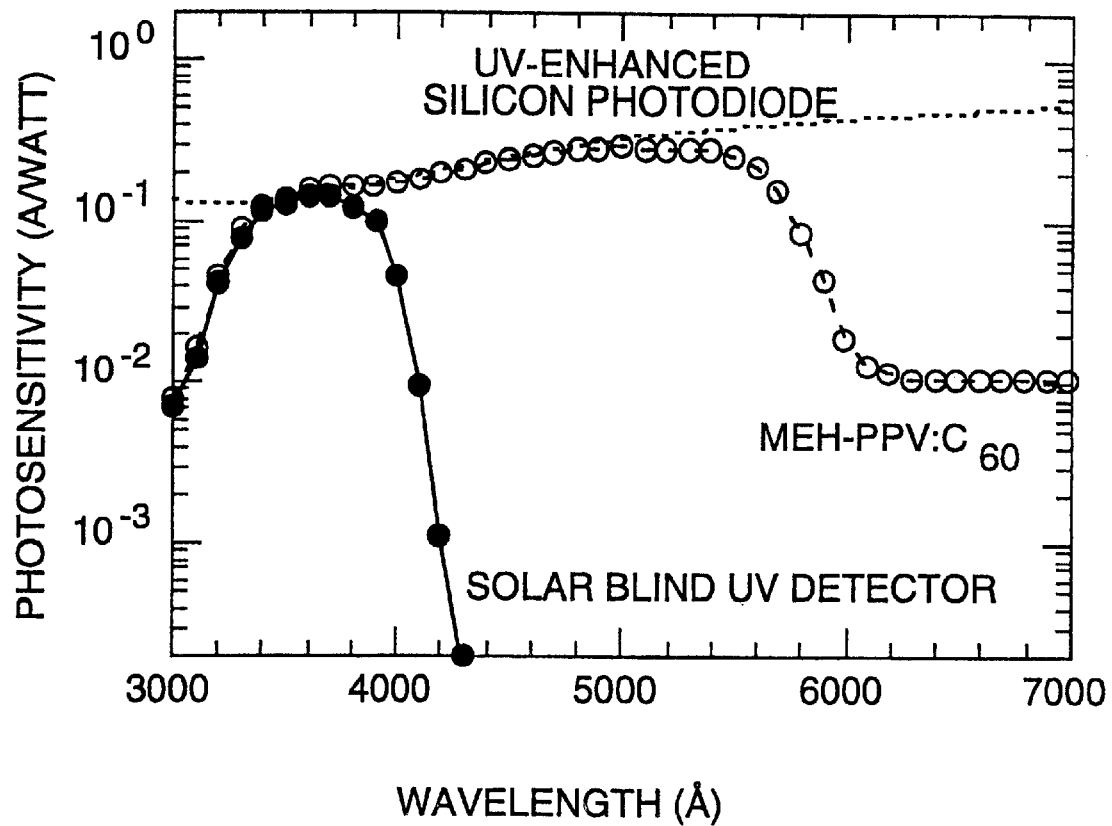
FIG. 14 is a graph of the spectral response of a solar blind UV detector operating at −2V. The photoresponse of the MEH-PPV:C$_{60}$ photodiode on ITO/glass substrate and the photoresponse of an UV-enhanced Si photodiode are plotted for comparison.

Solar-blind UV detectors were fabricated with polyblend MEH-PPV:$C_{60}$. ITO and Al were used as anode and cathode materials. The devices were fabricated on an UV bandpass filter purchased from Melles Griot Inc. (product No. 03 FCG 177). FIG. 14 shows the spectral response of the UV detector operating at −2V. The spectral response of the MEH-PPV:$C_{60}$ photodiode on ITO/glass substrate and the response of an UV-enhanced Si photodiode are plotted for comparison. The data show that the polymer UV detector was sensitive to UV radiation between 300–400 nm with photosensitivity of ~150 mA/W, comparable to that of UV-enhanced silicon photodiode. The data also show that the photoresponse of the MEH-PPV photodiode was suppressed (over $10^3$ times) by the optical bandpass filter.

This example demonstrates that high sensitivity, solar-blind UV detectors can be fabricated by integrating voltage-switchable organic photodiodes with UV high frequency pass optical filters.

Example 17

Figure 15A:
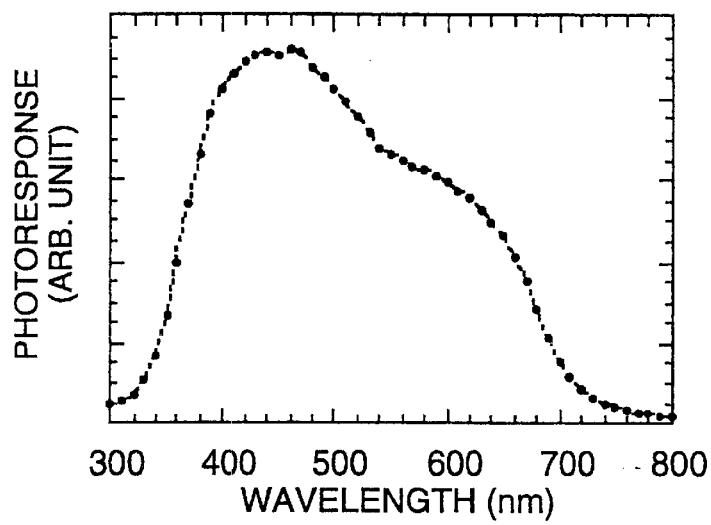
FIG. 15(a) is a graph of the response of a PTV photodiode.
Figure 15B:
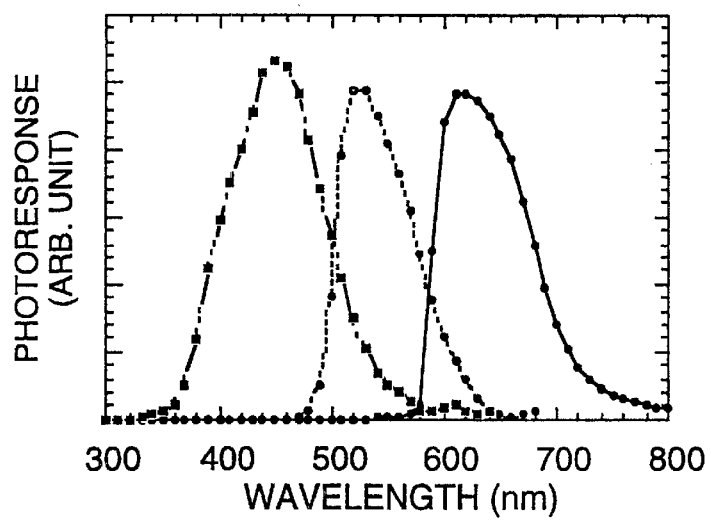
FIG. 15(b) is a graph of the photoresponse of R, G, B photosensors made of PTV photodiodes coupled with a color-filter panel.
Figure 15C:
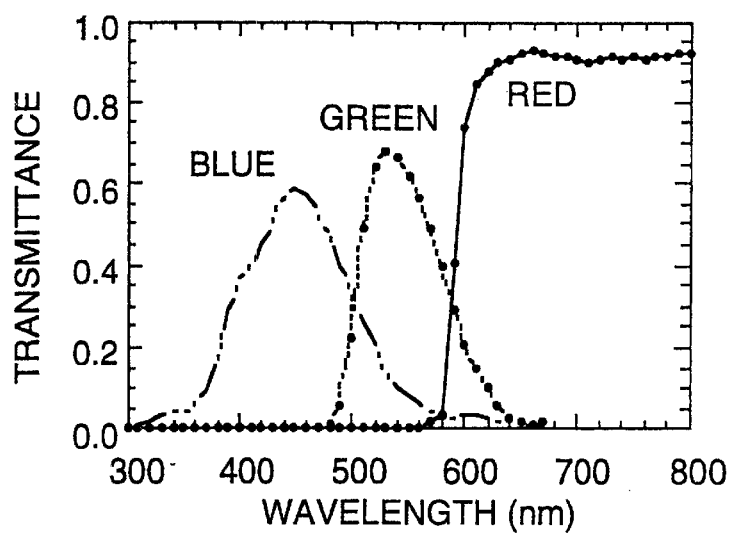
FIG. 15(c) is a graph of the transmittance of the color filters used in the generation of the data graphed in FIGS. 15(a) and 15(b)

Example 14 was repeated except that the active layer was a thin PTV layer. The spectral response of a PTV photodiode is shown in FIG. 15(a), which covers the range from 300 to 700 nm; i.e., spanning the entire visible range. Selected color detection was achieved by inserting a bandpass filter or a long wavelength filter in front of the detectors. FIG. 15(b) shows the responses of a blueolor pixel, a green-color pixel and a red-color pixel made with a panel of color filters and an array of PTV photodiodes. The transmittance of the corresponding R,G,B color filters is shown in FIG. 15(c).

This example demonstrates that by coupling the polymer image sensor with a panel of color filters, R,G,B color recognition can be achieved with a panel of polymer photodiode matrix with response covering entire visible spectrum.

Example 18

Figure 16A:
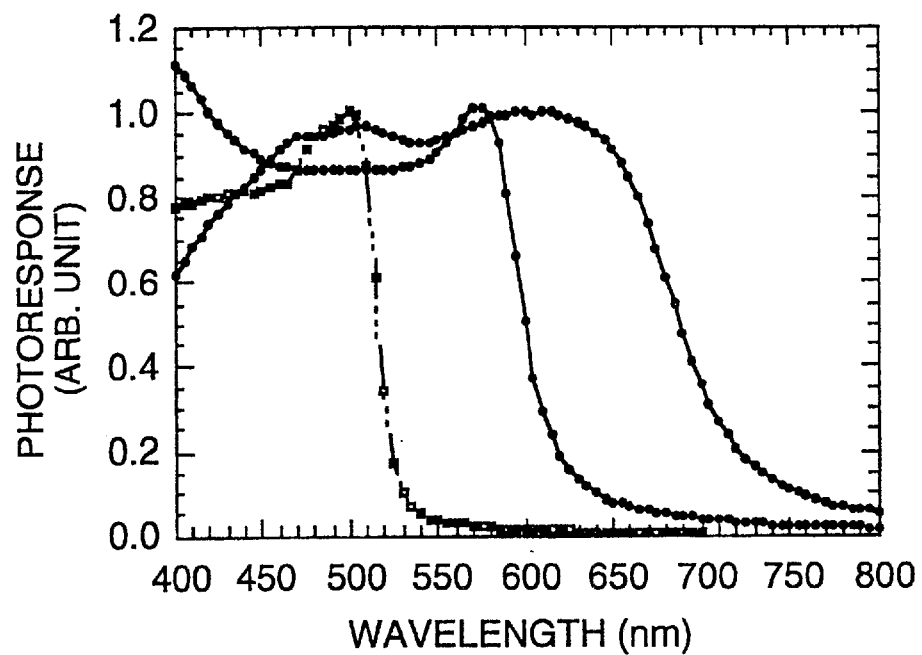
FIG. 16(a) is a graph of normalized spectral response of photodiodes made with PPV (open squares), PDHPV (open circles), and PTV (solid circles)

Red, green and blue (R,G,B) color detection were achieved following the approach shown in FIG. 5. The materials used for the active layers were PPV with a long wavelength cut-off at 500 nm; poly(dihexyloxy phenylene vinylene), "PDHPV", with a long wavelength cut-off at 600 nm; and PTV with long wavelength cut-off at 700 nm. Films were cast from solutions in their precursor forms with thickness between 1000 Å–3000 Å. Conversion to the conjugated forms was carried out at temperatures between 150–230° C. The conjugated films formed in this way were insoluble to organic solvents. Thus, patterning of these materials on a single substrate in dot or strip shapes can be achieved with standard photolithography, screen printing and the like. The normalized photoresponse of these photodiodes is shown in FIG. 16(a). An ITO/glass substrate was used in this experiment which is optically transparent in visible and opaque in UV.

Figure 16B:
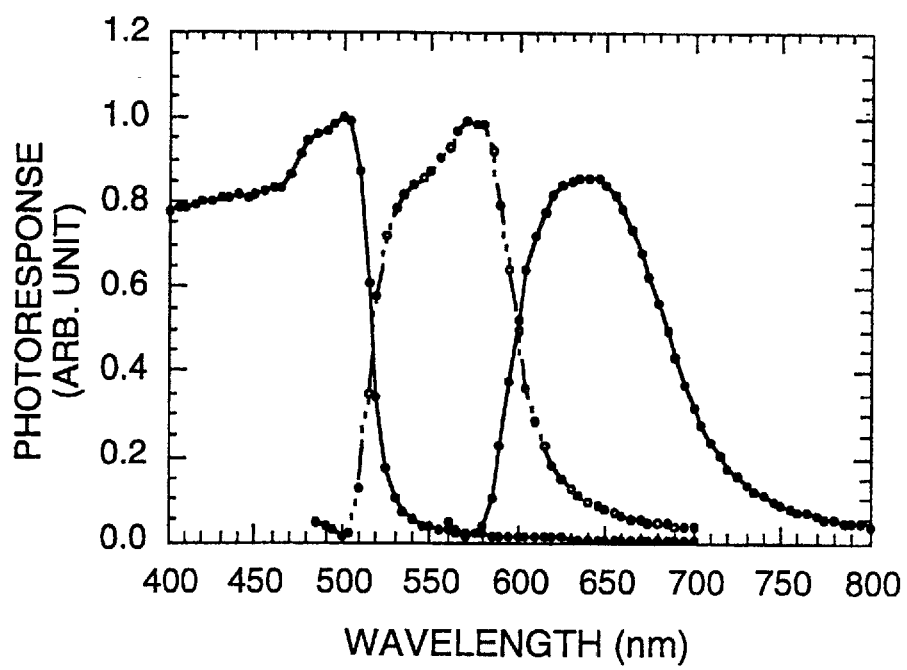
FIG. 16(b) is a graph of red, green and blue color detection derived from the diode responses in FIG. 16(a)

Red and green selective color detection were achieved by differentiation of the signals from these photodiodes (this operation can be done easily in the read-out circuit). The differential responses of these photodiodes are shown in FIG. 16(b). Red color detection (with response between 600–700 nm) was achieved by subtracting the signal from the PTV photodiode from the signal from the PDHPV photodiode. Green color detection (with response between 500–600 nm) was achieved by subtraction of the PDHPV signal from the PPV signal. The blue color detection was obtained by PPV photodiode directly.

This example demonstrates that R,G,B selected color detection and full-color image sensors can be achieved by patterning three photosensitive materials on a substrate with uniform optical characteristics.

Example 19

Figure 17:
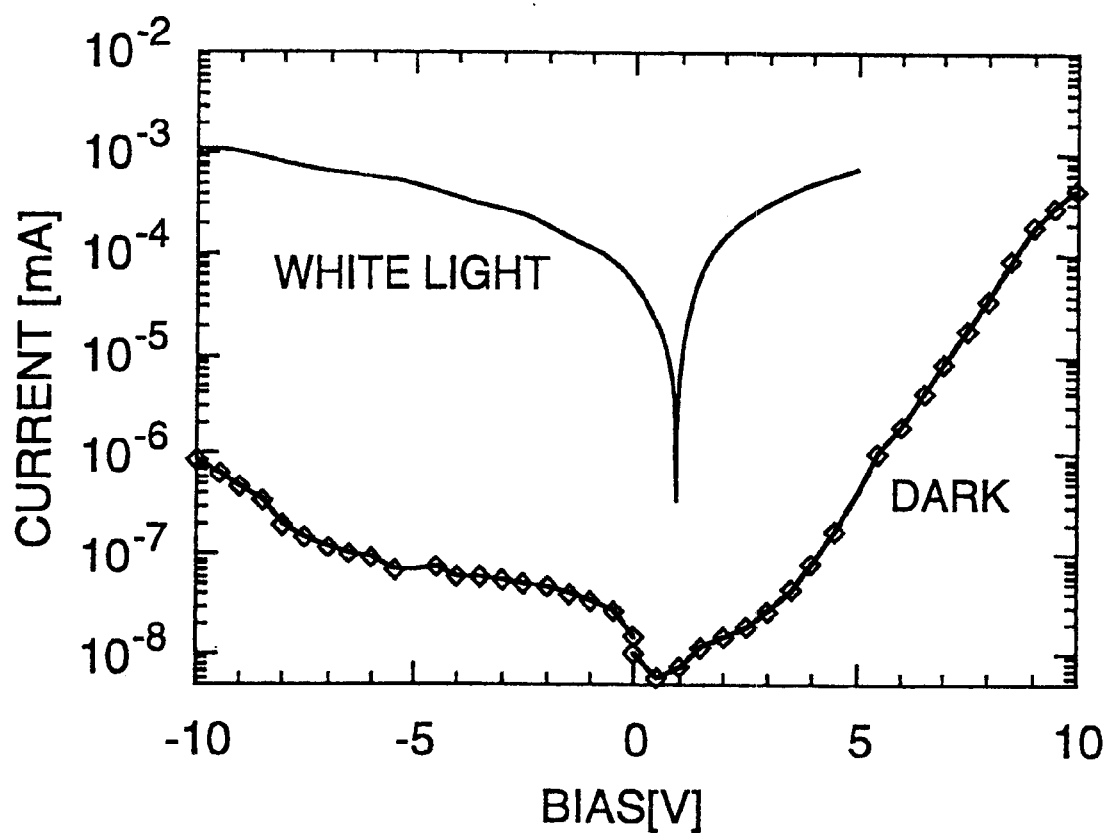
FIG. 17 is a graph showing I-V response of a PPV photodiode in the dark and under illumination.

Voltage switchable photodiodes were fabricated with the conjugated polymer poly(p-phenyl vinylene), PPV as photoactive material. The PPV films were spin-cast onto ITO substrates from a nonconjugated precursor solution and then converted to conjugated form by heating at 200–230° C. for 3 hours. Al was used as the back electrode. The active area was ~0.15 $cm^2$. The I-V characteristics of this photodiode in the dark and under illumination are shown in FIG. 17. The photocurrent/darkcurrent ratio is in the range of $10^4$ for white light illumination of a few mW/$cm^2$. Relatively low dark current was observed in forward bias as compared to that observed in photodiodes of, for example, in Example 1. This allows photodetection in both forward bias and reverse bias as shown in FIG. 17. The photosensitivity can be switched on and off by varying the external biasing voltage. For example, under white (or UV) light illumination, the photocurrent at +5V or −5V is 2000 times higher than that at +0.95V (or 0.3V).

This example demonstrates that the photodiode can be switched on by applying a forward bias (beyond the vicinity of the voltage corresponding the off state) or a reverse bias. Photodiodes operable in both switch polarities are useful in certain circuit designs and applications.

Example 20

Figure 18:
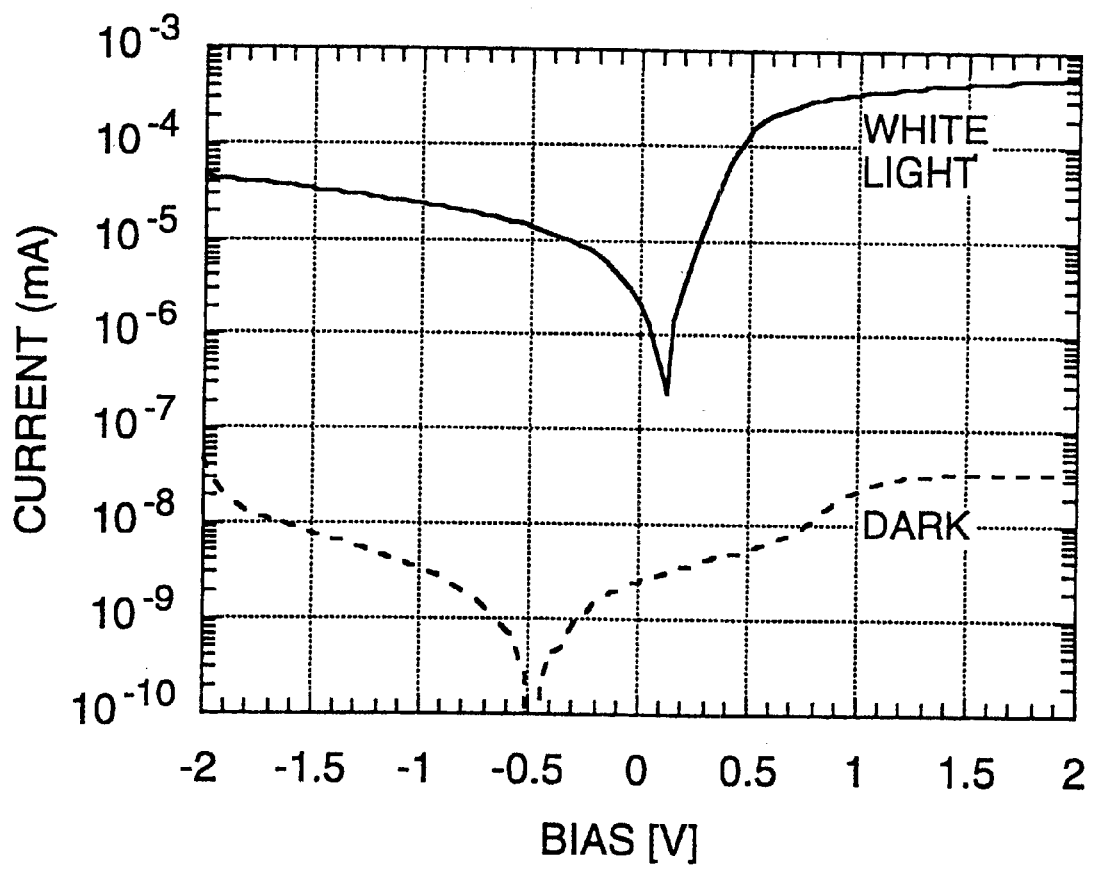
FIG. 18 is a graph showing I-V response of a photodiode in the dark and under illumination. The photoactive layer is in donor/acceptor bilayer structure.

Voltage switchable photodiodes were fabricated which had a heterojunction structure as their active layers, they had an ITO/donor layer/acceptor layer/metal structure. The materials used for the donor layer were MEH-PPV and PPV. The material used for the acceptor layer were $C_{60}$, laid down by physical vapor deposition and PCBM and PCBCR laid down by drop casting or spin casting. A data set for a MEH-PPV/$C_{60}$ photodiode is shown in FIG. 18.

Multiple junctions were observed in these devices. A build-up potential of ~–0.5V (forward bias was assigned as the positive bias to ITO) was seen in the I-V curve taken in dark. The other junction was revealed when the devices were illuminated. The overall effective barrier is ~0.15V (changed sign). The photocurrent/darkcurrent ratio was $10^4$ over a broad bias range. Voltage switchable photosensitivity was seen in both forward and reverse bias. For instance, the on/off ratio of the photocurrent is ~$10^3$ between +2V and +0.15V bias.

This example demonstrates that voltage switchable photodiodes can be fabricated in heterojunction form with two (or more) organic semiconductors with different electronic structures. The photosensitive mode can be achieved in both forward and reverse biases in these devices.

What is claimed is:

1. A switchable organic photodiode detector comprising a photodiode and a voltage source, said photodiode having a built-in potential and comprising:

a support substrate;

a first electrode disposed on said support substrate;

a photoactive organic layer disposed on said first electrode;

a second electrode disposed on said photoactive organic layer; and said voltage source adapted to selectively apply a switching voltage across said first electrode and said second electrode, said switching voltage imparting a photosensitivity above 1 mA/W at an operating reverse or forward bias and near-zero photosensitivity at a cut-off bias substantially equivalent in magnitude to said built-in potential.

2. A photodiode detector of claim 1 wherein the operating bias is an operating reverse bias.

3. A photodiode detector of claim 1 wherein the operating bias is an operating forward bias.

4. A read-out circuit using an organic photodiode detector of claim 1, wherein the operating bias is greater than 1 V and represents an ON state of the photodiode, said detector having a photosensitivity above 1 mA/W in said ON state, and wherein the cut-off bias represents an OFF state of the photodiode equivalent to zero photoresponse at an output of the read-out circuit.

5. A photodiode array comprising a plurality of photodiode detectors of claim 1 said detectors having their photodiodes arranged in an array, each of said photodiodes being selectively addressable as a pixel of said array.

6. The photodiode array of claim 5, wherein said array is a linear array with a common anode and individual cathodes, said common anode connected to a fixed anode voltage level and the individual cathodes connected to a switchable voltage changeable between a greater than the anode voltage and imparting photosensitivity and a second voltage which does not impart photosensitivity.

7. The photodiode array of claim 5, wherein said array is a linear array with a common cathode and individual anodes, said common cathode connected to a fixed cathode voltage and the individual anodes connected to a switchable voltage changeable between a voltage lower than the cathode voltage and imparting photosensitivity and a second voltage which does not impart photosensitivity.

8. The photodiode array of claim 5, wherein said array comprises at least one row of photodiodes and at least one column of photodiodes, each row having associated therewith a common anode, each column having associated therewith a common cathode, the first electrode of each photodiode of a row being connected to said common anode, the second electrode of each photodiode of a column being connected to said common cathode, said voltage source adapted to apply said switching voltage across at least one common anode and at least one common cathode to thereby selectively activate at least one pixel of said array.

9. The photodiode array of claim 8, wherein said switching voltage is applied across a plurality of common cathodes and at least one common anode to thereby selectively activate at least one row of pixels of said array.

10. The photodiode array of claim 8, wherein said switching voltage is applied across a plurality of common anodes and at least one common cathode to thereby selectively activate at least one column of pixels of said array.

11. The photodiode array of claim 10, wherein a sequential read-out of said selectively activated column is effected, said selective read-out comprising:

sequentially activating a selected column of photodiodes by, applying an operating bias voltage across the common cathode associated with said selected column and all the common anodes, said operating voltage imparting to each photodiode of the selected column a photosensitivity above 1 mA/W;

applying a cut-off voltage across remaining cathodes and all the anodes, said cut-off voltage being equivalent in magnitude to said built-in potential and imparting to the photodiodes of all columns other than the selected column near-zero photosensitivity; and sequentially reading out the generated output of the selected column of photodiodes.

12. The photodiode array of claim 10, wherein a sequential read-out of said selectively activated row is effected, said selective read-out comprising:

sequentially activating a selected row of photodiodes by;

applying an operating bias voltage across the common anode associated with said selected row and all the common cathodes, said operating voltage imparting to each photodiode of the selected row a photosensitivity above 1 mA/W;

applying a cut-off voltage across remaining anodes and all the cathodes, said cut-off voltage being equivalent in magnitude to said built-in potential and imparting to the photodiodes of all rows other than the selected row near-zero photosensitivity; and sequentially reading out the generated output of the selected row of photodiodes.

13. The photodiode array of claim 5, wherein said array is a two-dimensional array with a plurality of common anodes in a first direction and a plurality of common cathodes in a second direction.

14. The photodiode array of claim 13 wherein the signal from the photodiode array is ready by means for applying a given voltage level which does not impart photosensitivity to all the common anodes and all the common cathodes except for a common cathode being read which is biased to a voltage imparting photosensitivity.

15. The photodiode array of claim 14 wherein the signal from the photodiode array is read by means for applying a given voltage level which does not impart photosensitivity to all the common cathodes and all of the common anodes except for a common anode being read which is biased to a voltage imparting photosensitivity.

16. The photodiode array of claim 14 or 15 wherein the individual photodiodes coupled to the common electrode being read are individually read by means for applying a biasing voltage to the individual electrodes importing photosensitivity.

17. A scannable array of voltage switchable organic photodiodes each having a built-in potential and a predetermined photosensitivity range, said array comprising:
   a support substrate;
   a first electrode layer comprising at least one linear electrode disposed on said support substrate along a first direction;
   a photoactive organic layer disposed on said linear electrode;
   a second electrode layer comprising a plurality of linear electrodes disposed on said photoactive layer along a second direction transverse to said first direction; and
   a voltage source adapted to apply a switching voltage across at least one electrode of said first electrode layer and at least one electrode of said second electrode layer, said switching voltage thereby imparting to at least one selected photodiode a photosensitivity above 1 mA/W at an operating bias and near-zero photosensitivity at a cut-off bias substantially equivalent in magnitude to said built-in potential.

18. A scannable array of claim 17 wherein the operating bias is an operating reverse bias.

19. A scannable array of claim 17 wherein the operating bias is an operating forward bias.

20. An organic photodiode detector comprising a photodiode and a voltage source, said photodiode having a built-in potential and a prescribed photosensitivity range in response to incident radiation, said photodiode comprising:
   a support substrate;
   a first electrode disposed on said support substrate;
   a photoactive organic layer disposed on said first electrode;
   a second electrode disposed on said photoactive organic layer; and
   said voltage source adapted to apply an operating biasing voltage across said first electrode and said second electrode, said biasing voltage operating to vary said prescribed photosensitivity range.

21. An organic photodiode detector of claim 20 wherein the operating bias is an operating forward bias.

22. The organic photodiode detector of claim 20, wherein said support substrate and said first electrode are substantially transparent to incident radiation.

23. The organic photodiode detector of claim 20, wherein said second electrode is substantially transparent to incident radiation.

24. The organic photodiode detector of claim 20, wherein said photoactive organic layer is comprised of a donor/acceptor polyblend, said donor being selected from poly(phenylenevinylene), polythiophene, poly(thiophene vinylene), and soluble derivatives thereof, including MEH-PPV, said acceptor being selected from poly(cyanophenylene vinylene), fullerene molecules including $C_{60}$ and functional derivates thereof, PCMB and PCBCR.

25. The organic photodiode detector of claim 20, wherein said photoactive organic layer is comprised of a polymer/polymer polyblend.

26. The organic photodiode detector of claim 20, wherein said photoactive organic layer is comprised of a polymer/(organic molecule) polyblend.

27. The organic photodiode detector of claim 20, wherein said photoactive organic layer is comprised of a material selected from:
   anthracene and its derivatives,
   tetracene and its derivatives,
   phthalocyanine and its derivatives,
   pinacyanol and its derivatives,
   fullerene $C_{60}$ and its derivatives,
   thiophene and its derivatives,
   phenylene and its derivatives,
   triphenylene and its derivatives including 2,3,6,7,10,11-hexahexylthiotriphenylene,
   $6T/C_{60}$ and its derivatives,
   6T/pinacyanol and its derivatives,
   phthalocyanine/o-chloranil and blends comprising their derivatives,
   anthracene/$C_{60}$ and its derivatives,
   anthracene/o-chloranil and its derivatives.

28. The organic photodiode detector of claim 20, wherein said second electrode comprises a conducting polymer selected from poly(aniline-camphor sulfonic acid), poly(ethylenedioxythiophene)-polystyrenesulfonate, and polypyrrole.

29. The organic photodiode detector of claim 20, wherein said organic photodiode detector is provided with a layer which generates mobile electrons and holes in response to ionized particles.

30. The organic photodiode detector of claim 20, wherein said organic photodiodes are formed using soluble semiconducting conjugated polymers cast from solution.

31. An organic photodiode detector of claim 20 wherein the operating bias is an operating reverse bias.

32. The organic photodiode detector of claim 31, wherein the photosensitivity of said photodiode is above 1 mA/W at an operating reverse bias of said voltage source and is at a near-zero level at a cut-off bias substantially equivalent in magnitude to said built-in potential, said voltage source being selectively switchable between said operating reverse bias and said cut-off bias.

33. A read-out circuit using the organic photodiode detector of claim 32, wherein the operating reverse bias is in the range of 2–15 V and represents an ON state of the photodiode, said detector having a photosensitivity above 1 mA/W in said ON state, and wherein the cut-off bias represents an OFF state of the photodiode equivalent to zero photoresponse at an output of the digital read-out circuit.

34. A photodiode array comprising a plurality of photodiodes of claim 20 arranged in an array, each of said photodiodes being selectively addressable as a pixel of said array.

35. The organic photodiode detector of claim 34, wherein said pixels are adapted for selection by setting a voltage bias pattern which inhibits crosstalk during read-out.

36. The photodiode array of claim 34, wherein said array comprises at least one row of photodiodes and at least one column of photodiodes, each row having associated therewith a common anode, each column having associated therewith a common cathode, the first electrode of each photodiode of a row being connected to said common anode, the second electrode of each photodiode of a column being connected to said common cathode, said voltage source adapted to apply said biasing voltage across at least one common anode and at least one common cathode to thereby selectively activate at least one pixel of said array.

37. The photodiode array of claim 36, wherein said biasing voltage is applied across a plurality of common anodes and at least one common cathode to thereby selectively activate at least one column of pixels of said array.

38. The organic photodiode detector of claim 20, wherein said photoactive organic layer is comprised of a semiconducting conjugated polymer.

39. The organic photodiode detector of claim 38, wherein said semiconducting conjugated polymer is in doped form.

40. The organic photodiode detector of claim 38, wherein said semiconducting conjugated polymer is in an intrinsic neutral state.

41. The organic photodiode detector of claim 38, wherein said semiconducting conjugated polymer is selected from:
   poly(phenylenevinylene), and its derivatives;
   polythiophene, and its derivatives;
   poly(thiophene vinylene), and its derivatives;
   polyacetylene, and its derivatives;
   polyisothianaphene, and its derivatives;
   polypyrrole, and its derivative;
   poly(2,5-thienylenevinylene), and its derivatives;
   poly(p-phenylene), and its derivatives;
   polyflourene, and its derivatives;
   polycarbazole, and its derivatives;
   poly(1,6-heptadiyne), and its derivatives;
   polyquinolene, and its derivatives; and
   polyaniline, and its derivatives.

42. The organic photodiode detector of claim 20, wherein said photoactive organic layer is arranged in a semiconducting heterojunction structure having at least one set of donor and acceptor regions disposed therein.

43. The organic photodiode detector of claim 42, wherein said heterojunction structure comprises a polymer selected from:
   poly(phenylenevinylene) and its derivatives,
   polythiophene and its derivatives,
   poly(thiophene vinylene) and its derivatives,
   polyacetylene and its derivatives,
   polyisothianaphene and its derivatives,
   polypyrrole and its derivatives,
   poly(2,5-thienylenevinylene) and its derivatives,
   poly(p-phenylene) and its derivatives,
   polyflourene and its derivatives,
   polycarbazole and its derivatives,
   poly(1,6-heptadiyne) and its derivatives,
   polyquinolene and its derivatives,
   polyaniline and its derivatives,
   anthracene and its derivatives,
   tetracene and its derivatives,
   phthalocyanine and its derivatives,
   pinacyanol and its derivatives,
   fullerene $C_{60}$ and its derivatives,
   thiophene and its derivatives,
   phenylene and its derivatives,
   triphenylene and its derivatives including 2,3,6,7,10,11-hexahexylthiotriphenylene,
   $6T/C_{60}$ and its derivatives,
   6T/pinacyanol and its derivatives,
   phthalocyanine/o-chloranil and its derivatives,
   anthracene/$C_{60}$ and its derivatives, and
   anthracene/o-chloranil and its derivatives.

44. The organic photodiode detector of claim 20, wherein said photoactive organic layer comprises an optically inert organic additive.

45. The organic photodiode detector of claim 44, wherein the optically inert organic additive is an anionic surfactant.

46. The organic photodiode detector of claim 44, wherein the optically inert organic additive is an organic electrolyte.

47. The organic photodiode detector of claim 20, wherein said first or second electrodes (or both) comprises a conducting polymer selected from poly(aniline-camphor sulfonic acid), poly(ethylenedioxythiophene)-plystyrenesulfonate, and polypyrrole.

48. The organic photodiode detector of claim 47 wherein said first electrode comprises a conducting polymer selected from poly(aniline-camphor sulfonic acid), poly(ethylenedioxythiophene)-plystyrenesulfonate, and polypyrrole.

49. The organic photodiode detector of claim 20, wherein said organic photodiode detector is provided with an optical filter layer adapted to restrict transmission of incident radiation to a predetermined wavelength range.

50. The organic photodiode detector of claim 49, wherein said support substrate operates as said optical filter layer.

51. The organic photodiode detector of claim 49, wherein said wavelength range is the human visible spectrum.

52. The organic photodiode detector of claim 20, wherein said photodiode comprises a pixel having a first sensor means for detecting radiation in the red range, a second sensor means for detecting radiation in the green range, and a third sensor means for detecting radiation in the blue range.

53. The organic photodiode detector of claim 52, wherein said pixel is provided with a color filter panel for effecting selective color transmittance.

54. The organic photodiode detector of claim 52, wherein said first sensor means comprises a photodiode sensitive to wavelengths shorter than 700 nm, said second sensor means comprises a photodiode sensitive to wavelengths shorter than 600 nm, and said third sensor means comprises a blue-sensitive active layer.

55. The organic photodiode detector of claim 20, wherein said organic photodiode detector is provided with a scintillating material adapted to emit photons in response to ionized particles.

56. The organic photodiode detector of claim 55, wherein said scintillating material is a phosphor layer.

57. The organic photodiode detector of claim 55, wherein said ionized particles are selected from high energy photons, electrons, x-rays, beta particles, and gamma radiation.

58. The organic photodiode detector of claim 55, wherein said wavelength range is in the UV spectrum.

* * * * *